(12) United States Patent
Kobayashi et al.

(10) Patent No.: US 10,811,455 B2
(45) Date of Patent: *Oct. 20, 2020

(54) SEMICONDUCTOR APPARATUS AND EQUIPMENT

(71) Applicant: CANON KABUSHIKI KAISHA, Tokyo (JP)

(72) Inventors: Hiroaki Kobayashi, Kawasaki (JP); Atsushi Furubayashi, Kawasaki (JP); Katsuhito Sakurai, Machida (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/142,997

(22) Filed: Sep. 26, 2018

(65) Prior Publication Data

US 2019/0103434 A1 Apr. 4, 2019

(30) Foreign Application Priority Data

Sep. 29, 2017 (JP) .................. 2017-192048

(51) Int. Cl.
*H01L 27/14* (2006.01)
*H01L 27/146* (2006.01)
*H04N 5/369* (2011.01)
*H04N 5/378* (2011.01)
*H04N 5/3745* (2011.01)

(52) U.S. Cl.
CPC .. *H01L 27/14636* (2013.01); *H01L 27/14634* (2013.01); *H04N 5/378* (2013.01); *H04N 5/379* (2018.08); *H01L 27/14621* (2013.01); *H01L 27/14623* (2013.01); *H01L 27/14627* (2013.01); *H01L 27/14643* (2013.01); *H04N 5/37457* (2013.01)

(58) Field of Classification Search
CPC ............ H01L 27/146; H01L 27/14636; H01L 27/14643
See application file for complete search history.

(56) References Cited

U.S. PATENT DOCUMENTS 8,767,107 B2 * 7/2014 Teshima ................. H04N 5/365
348/300
8,773,562 B1 * 7/2014 Fan .................... H01L 27/14643
348/308

(Continued)

FOREIGN PATENT DOCUMENTS

CN 102646688 A 8/2012
JP 2011-204915 A 10/2011

(Continued)

*Primary Examiner* — Nicholas J Tobergte
(74) *Attorney, Agent, or Firm* — Canon U.S.A., Inc. IP Division

(57) ABSTRACT

A semiconductor apparatus includes a stack of a first chip having a plurality of pixel circuits arranged in a matrix form and a second chip having a plurality of electric circuit arranged in a matrix form. A wiring path between a semiconductor element configuring the pixel circuit and a semiconductor element configuring the electric circuit or a positional relationship between a semiconductor element configuring the pixel circuit and a semiconductor element configuring the electric circuit is differentiated among the electric circuits.

20 Claims, 9 Drawing Sheets

(56) References Cited

U.S. PATENT DOCUMENTS

| | | | |
|---|---|---|---|
| 9,025,062 B2* | 5/2015 | Teshima | H04N 5/365 348/300 |
| 9,087,758 B2* | 7/2015 | Mabuchi | H01L 27/14632 |
| 9,171,968 B2* | 10/2015 | Oka | H01L 31/02 |
| 9,245,917 B2* | 1/2016 | Fan | H01L 27/14643 |
| 9,634,060 B2* | 4/2017 | Shizukuishi | H01L 27/14634 |
| 10,319,774 B2* | 6/2019 | Arita | H04N 5/374 |
| 2010/0259662 A1* | 10/2010 | Oike | H04N 5/335 348/308 |
| 2012/0007253 A1 | 1/2012 | Yang | |
| 2012/0120293 A1* | 5/2012 | Mabuchi | H01L 27/14632 348/302 |
| 2012/0199930 A1 | 8/2012 | Hayashi | |
| 2013/0033632 A1* | 2/2013 | Kishi | H01L 27/14634 348/308 |
| 2014/0077057 A1 | 3/2014 | Chao | |
| 2019/0104267 A1* | 4/2019 | Kobayashi | H04N 5/36963 |
| 2019/0104270 A1* | 4/2019 | Sakurai | H04N 5/379 |

FOREIGN PATENT DOCUMENTS

| | | |
|---|---|---|
| JP | 2012-104684 A | 5/2012 |
| JP | 2013-51674 A | 3/2013 |
| JP | 2014-30170 A | 2/2014 |
| JP | 2014-160042 A | 9/2014 |
| JP | 2015-66298 A | 4/2015 |
| JP | 2015-70591 A | 4/2015 |
| JP | 2016-18919 A | 2/2016 |
| JP | 2016-519591 A | 7/2016 |
| JP | 2016-171399 A | 9/2016 |
| JP | 2017-92990 A | 5/2017 |
| JP | 2017-201709 A | 11/2017 |
| TW | I291226 B | 12/2007 |
| TW | 201212212 A | 3/2012 |
| TW | I467746 B | 1/2015 |

* cited by examiner

SEMICONDUCTOR APPARATUS AND EQUIPMENT

BACKGROUND OF THE INVENTION

Field of the Invention

The present disclosure relates to a semiconductor apparatus having a stack of a plurality of chips.

Description of the Related Art

A semiconductor apparatus may be used as an imaging apparatus having a stack of a chip including a pixel circuit and a chip including an electric circuit configured to process a signal from the pixel circuit may be used for greatly improved values of the imaging apparatus. Japanese Patent Laid-Open No. 2012-104684 and Japanese Patent Laid-Open No. 2013-51674 disclose that a substrate having a pixel unit thereon and a substrate having a plurality of column circuits thereon are stacked.

Japanese Patent Laid-Open No. 2013-51674 merely discloses use of a multi-layer wiring for the connection between the substrates, which has not been sufficient examination. Accordingly, improvements may still be necessary for performance and quality of a semiconductor apparatus, reduction of time and cost for delivery from a design phase to a manufacturing phase for value enhancement of the semiconductor apparatus.

The present disclosure provides an advantageous technology for value improvement of the semiconductor apparatus.

SUMMARY OF THE INVENTION

According to a first aspect of the present disclosure, a semiconductor apparatus includes a stack of a first chip and a second chip, wherein the first chip has a plurality of pixel circuits arranged in a matrix form of J rows and K columns, and the second chip has a plurality of electric circuit arranged in a matrix form of T rows and U columns. The first chip includes a first semiconductor layer having a plurality of semiconductor elements configuring the plurality of pixel circuits and a first wiring structure including M wiring layers configuring the plurality of pixel circuits. The second chip includes a second semiconductor layer having a plurality of semiconductor elements configuring the plurality of electric circuits and a second wiring structure including N wiring layers configuring the plurality of electric circuits. The first wiring structure is placed between the first semiconductor layer and the second semiconductor layer. The second wiring structure is placed between the first wiring structure and the second semiconductor layer. A first conductive portion included in an M-th wiring layer of the first wiring structure from the first semiconductor layer and connected to a circuit of the plurality of pixel circuits and a second conductive portion included in an N-th wiring layer of the second wiring structure from the second semiconductor layer and connected to a circuit of the plurality of electric circuit are electrically connected. A third conductive portion included in the M-th wiring layer and connected to a circuit of the plurality of pixel circuits and a fourth conductive portion included in the N-th wiring layer and connected to a circuit of the plurality of electric circuit are electrically connected. A shortest wiring path from the second conductive portion to the plurality of semiconductor elements configuring the plurality of pixel circuits is a first length, and a shortest wiring path from the first conductive portion to the plurality of semiconductor elements configuring the plurality of electric circuits is a second length. A shortest wiring path from the fourth conductive portion to the plurality of semiconductor elements configuring the plurality of pixel circuits is a third length, and a shortest wiring path from the third conductive portion to the plurality of semiconductor elements configuring the plurality of electric circuit is a fourth length. A sum of the third length and the fourth length is longer than a sum of the first length and the second length.

According to a second aspect of the present disclosure, a semiconductor apparatus includes a stack of a first chip and a second chip, wherein the first chip has a plurality of pixel circuits arranged in a matrix form of J rows and K columns, and the second chip has a plurality of electric circuit arranged in a matrix form of T rows and U columns. The first chip includes a first semiconductor layer having a plurality of semiconductor elements configuring the plurality of pixel circuits and a first wiring structure including M wiring layers configuring the plurality of pixel circuits. The second chip includes a second semiconductor layer having a plurality of semiconductor elements configuring the plurality of electric circuits and a second wiring structure including N wiring layers configuring the plurality of electric circuits. The first wiring structure is placed between the first semiconductor layer and the second semiconductor layer. The second wiring structure is placed between the first wiring structure and the second semiconductor layer. A first conductive portion included in an M-th wiring layer of the first wiring structure from the first semiconductor layer and connected to a first circuit of the plurality of pixel circuits and a second conductive portion included in an N-th wiring layer of the second wiring structure from the second semiconductor layer and connected to a second circuit of the plurality of electric circuit are electrically connected. A shortest wiring path from the second conductive portion to the plurality of semiconductor elements configuring the plurality of pixel circuits is a first length, and a shortest wiring path from the first conductive portion to the plurality of semiconductor elements configuring the plurality of electric circuits is a second length, and wherein the first length is longer than the second length.

According to a third aspect of the present disclosure, a semiconductor apparatus includes a stack of a first chip and a second chip, wherein the first chip has a plurality of pixel circuits arranged in a matrix form of J rows and K columns, and the second chip has a plurality of electric circuit arranged in a matrix form of T rows and U columns. The first chip includes a first semiconductor layer having a plurality of semiconductor elements configuring the plurality of pixel circuits. The second chip includes a second semiconductor layer having a plurality of semiconductor elements configuring the plurality of electric circuits. The first wiring structure is placed between the first semiconductor layer and the second semiconductor layer. The second wiring structure is placed between the first wiring structure and the second semiconductor layer. A first semiconductor element configuring a first electric circuit of the plurality of electric circuits is electrically connected to at least one of the plurality of semiconductor elements configuring the plurality of pixel circuits through a first connecting unit configuring the first wiring structure and the second wiring structure. A second semiconductor element configuring a second electric circuit of the plurality of electric circuit is electrically connected to at least one of the plurality of semiconductor elements through the first connecting unit configuring the first wiring structure and the second wiring structure. A shortest distance from the second semiconductor element to a semiconductor element connected to the second connecting unit of the plurality of semiconductor elements configuring the plurality of pixel circuits is longer than a shortest distance from the first semiconductor element to a semiconductor element connected to the first connecting unit of the plurality of semiconductor elements configuring the plurality of pixel circuits.

Further features of the present invention will become apparent from the following description of exemplary embodiments with reference to the attached drawings.

DESCRIPTION OF THE EMBODIMENTS

Modes for embodying the present disclosure will be described below with reference to drawings. Like numbers refer to like parts throughout the following descriptions and the plurality of drawings. Common configurations will be described with mutual reference to a plurality of drawing, and any repetitive descriptions on like parts referred by like numbers will be omitted.

Figure 1A:
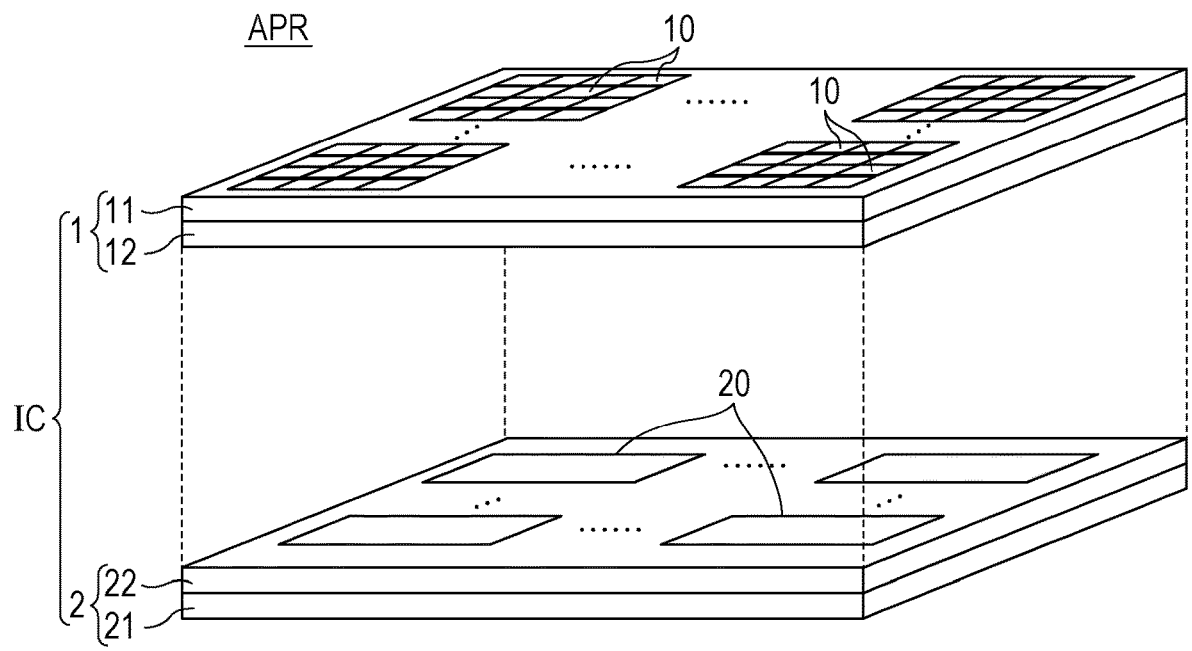
FIGS. 1A and 1B are schematic diagrams illustrating a semiconductor apparatus.

FIG. 1A illustrates a semiconductor apparatus APR. All or a part of the semiconductor apparatus APR are semiconductor apparatus ICs being a laminated member of a chip 1 and a chip 2. The semiconductor apparatus APR according to this embodiment is a photoelectric conversion apparatus which can be used as an image sensor, an AF (Auto Focus) sensor, a light metering sensor, or a ranging sensor, for example. The semiconductor apparatus APR includes a stack of the chip 1 and the chip 2. The chip 1 has a plurality of pixel circuits 10 in a matrix form. The chip 2 has a plurality of electric circuits 20 in a matrix form.

The chip 1 includes a semiconductor layer 11 and a wiring structure 12. The semiconductor layer 11 has a plurality of semiconductor elements (not illustrated) included in a plurality of pixel circuit 10. The wiring structure 12 includes M wiring layers (not illustrated) included in the plurality of pixel circuit 10, where M is an integer number. The chip 2 includes a semiconductor layer 21 and a wiring structure 22. The semiconductor layer 21 includes a plurality of semiconductor elements (not illustrated) included in a plurality of electric circuits 20. The wiring structure 22 includes N wiring layers (not illustrated) including a plurality of electric circuits 20, where N is an integer number.

A wiring structure 12 is disposed between a semiconductor layer 11 and a semiconductor layer 21. A wiring structure 22 is disposed between the wiring structure 12 and the semiconductor layer 21.

The pixel circuit 10 includes a photoelectric conversion element, details of which will be described below, and typically further includes an amplifying element. The electric circuit 20 is an electric circuit configured to drive the pixel circuit 10 and process a signal from the pixel circuit 10.

Figure 1B:
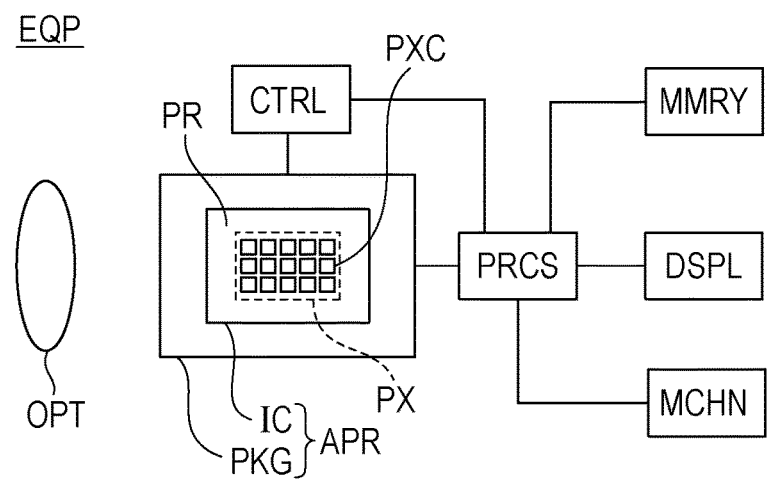

FIG. 1B illustrates an equipment EQP including a semiconductor apparatus APR. A semiconductor apparatus IC has a pixel area PX having pixels PXC including a pixel circuit 10 in a matrix form. The pixel CCT can include a photoelectric conversion element, an amplifying element, a microlens, and a color filter to be included in the pixel circuit 10. The semiconductor apparatus IC can have a peripheral area PR surrounding the pixel area PX. The peripheral area PR can have a circuit excluding the pixel circuit 10. The semiconductor apparatus APR can include a package PKG storing the semiconductor apparatus IC, in addition to the semiconductor apparatus IC. The equipment EQP can include at least one of an optical system OPT, a control device CTRL, a processing device PRCS, a display apparatus DSPL, a storage device MMRY and a mechanical apparatus MCHN. The equipment EQP will be described in detail.

First Embodiment

Figure 2A:
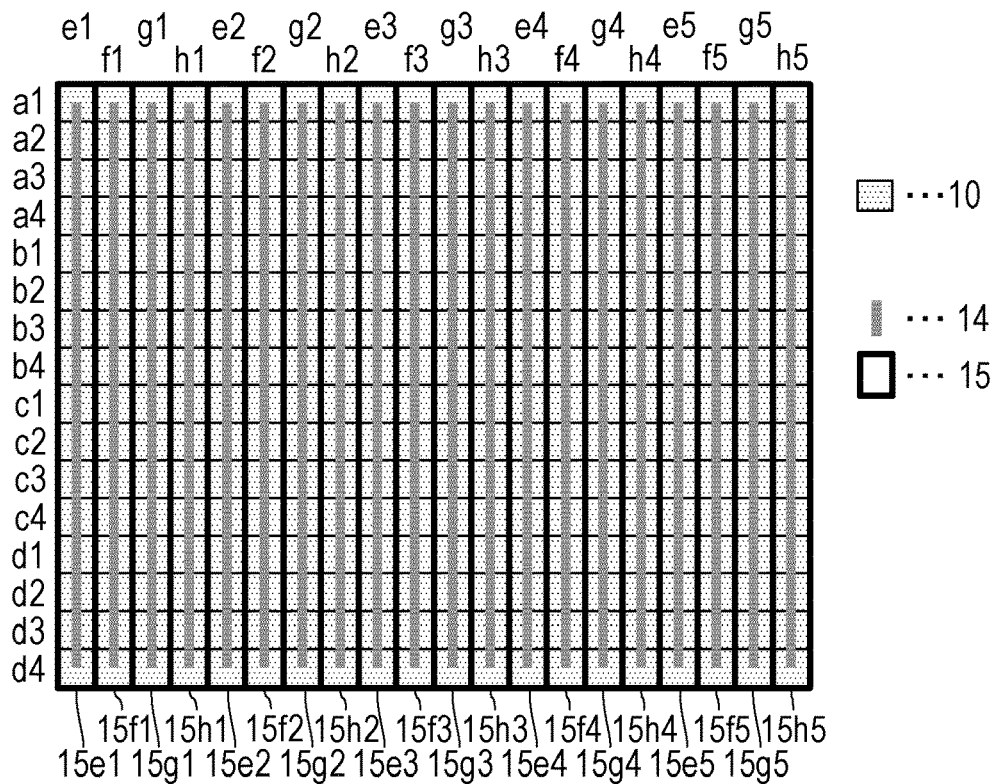
FIGS. 2A and 2B are schematic diagrams illustrating a semiconductor apparatus.
Figure 2B:
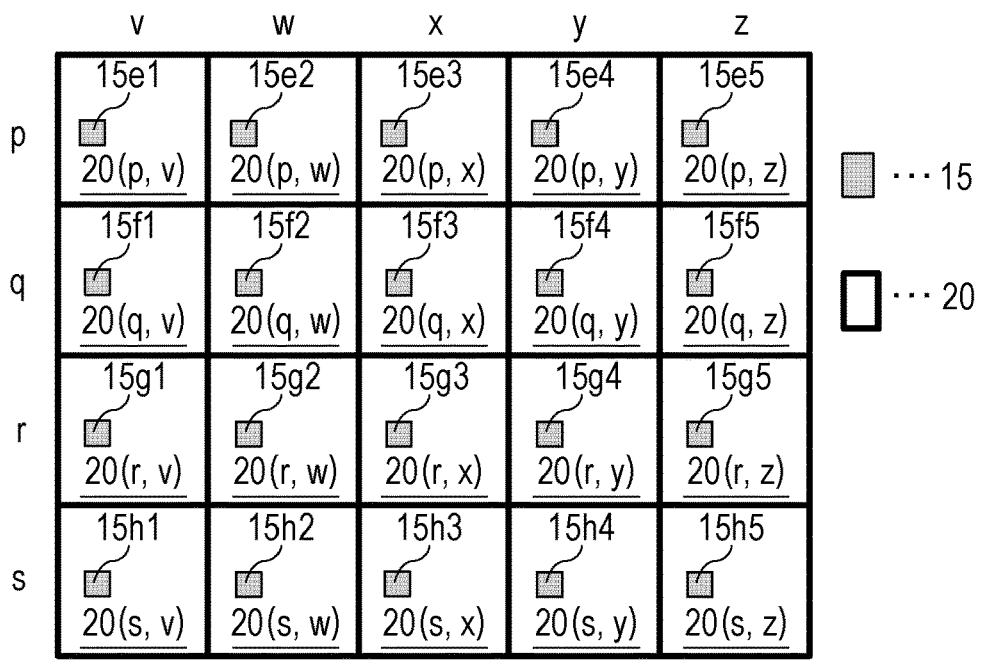

With reference to FIGS. 2A and 2B, a first embodiment will be described. FIG. 2A illustrates an arrangement of a plurality of pixel circuits 10 in J rows and K columns matrix form in the chip 1. Practically, J≥100, K≥100, and more preferably, J≥1000, K≥1000. The pixel circuit 10 has J rows including the a1-th row to the a4-th row, the b1-th row to the b4-th row, the c1-th row to the c4-th row, the d1-th row to the d4-th row in this order. The a1-th row to the a4-th row includes the a1-th row, the a2-th row, the a3-th row, and the a4-th row in this order, which are collectively called the a-th row. The b1-th row to the b4-th row are collectively called the b-th row, the c1-th row to the c4-th row are collectively called the c-th row, and the d1-th row to the d4-th row are collectively called the d-th row. The a, b, c, d are positive integers where a<b<c<d. The a1, a2, a3, and a4 are positive integers where a1<a2<a3<a4. For example, when a plurality of pixel circuits 10 illustrated in FIG. 2A are all pixel circuits 10, a1=1, a2=2, a3=3, a4=4, b1=5, b4=8, c1=9, c4=12, d1=13, and d4=J=16. The following descriptions assume that the a1-th row to the d4-th row are neighboring rows. When the rows are neighboring to each other, a2=1+a1, a3=1+a2, a4=1+a3, and b1=1+a4, c1=1+b4, d1=1+c4. However, this does not deny that there is a row, not illustrated, between two rows.

The pixel circuit 10 has K columns including the e1-th column, the f1-th column, the g1-th column, the h1-th column, the e2-th column, the f2-th column, the g2-th column, and the h2-th column in this order. In other words, e1, f1, g1, h1, e2, f2, g2, and h2 are positive integers where e1<f1<g1<h1<e2<f2<g2<h2. Also h2<e3<f3<g3<h3<e4<f4<g4<h4. For example, in a case where the plurality of pixel circuit 10 illustrated in FIG. 2A are all pixel circuits 10, e1=1, f1=2, g1=3, h1=4, e2=5, f2=6, g2=7, h2=8, h5=K=20. For convenience of description, the e1-th to the h5-th rows are adjacent to each other. In a case where columns are adjacent to each other, f1=1+e1, g1=1+f1, h1=1+g1, e2=1+h4, e3=1+h2, e4=1+h3, e5=1+h4. However, this does not deny that there is a column, not illustrated, between two columns.

In the following descriptions, a pixel circuit 10 of the α-th row and the β-th row is represented by a pixel circuit 10 (α, β). The angle formed by rows and column of the pixel circuit 10 is not limited to 90 degrees but may be in a range of 60 to 120 degrees, and the rows and columns may be arranged in a parallelogram matrix.

Two or more pixel circuits 10 of an identical column are connected to a signal line 14 in common. The signal line 14 extends along a direction in which the pixel circuits 10 of an identical column aligns. For example, pixel circuits 10(a1, e1), 10(b1, e1), 10(c1, e1), and 10(d1, e1) of the e1-th column are connected to a common signal line 14. Although all pixel circuits 10 of an identical column may be connected to one signal line 14, two or more pixel circuits 10 of a pixel circuits 10 of an identical column may be connected to a plurality of signal lines 14 in common. For example, pixel circuits 10(a2, e1), 10(b2, e1), 10(c2, e1), and 10(d2, e1) of the e1-th column may be connected in common to a signal line 14 different from the signal line 14 to which the pixel circuit 10(a1, e1) is connected. A plurality of pixel circuits 10 connected to a plurality of signal lines 14 are sequentially selected from a pixel circuit 10 to be read to the signal line 14 and are read out. Signals from the pixel circuits 10 of an identical column are read out in parallel to a plurality of signal lines 14 for increased speed of signal reading.

FIG. 2B illustrates a plurality of electric circuits 20 arranged in a T rows and U columns matrix form in the chip 2. Here, T<J, and U<K. T≥10 and U≥10 more practically, and T≤1000 and U≤1000 more preferably. A T-th row of the electric circuit 20 includes the pth, the qth, the rth, and the s-th rows in this order. In other words, p, q, r, s are positive integers where p<q<r<s. For example, a plurality of electric circuits 20 illustrated in FIG. 2B are all electric circuits 20, p=1, q=2, r=3, s=T=4. The following description assumes that the p-th to the s-th rows are neighboring to each other. When rows are neighboring, q=1+p, r=1+q, s=1+r. However, this does not deny that there is a row, not illustrated, between two rows.

A U column of the electric circuit 20 includes the v-th column, the w-th column, the x-th column, the y-th column, and the z-th column in this order. In other words, v, w, x, y, and z are positive integers where v<w<x<y<z. For example, when a plurality of electric circuits 20 illustrated in FIG. 2B are all electric circuits 20, v=1, w=2, x=3, y=4, z=U=5. The following descriptions assume that the v-th to z-th columns are neighboring to each other. When columns are neighboring to each other, w=1+v, x=1+w, y=1+x, z=1+y. However, this does not deny that there is a column, not illustrated, between two columns In the following descriptions, the electric circuits 20 of the γ-th row and the δ-th column are represented by an electric circuit 20(γ, δ). The angle formed by rows and column of the electric circuit 20 is not limited to 90 degrees but may be in a range of 60 to 120 degrees, and the rows and columns may be arranged in a parallelogram matrix.

When the chip 1 and the chip 2 are stacked, the direction of an alignment of rows of the electric circuits 20 may be along the direction of an alignment of rows of the pixel circuits 10. Also, the direction of an alignment of columns of the electric circuits 20 may be along the direction of an alignment of columns of the pixel circuits 10. This can prevent an unnecessary increase of the length of the wiring path between the pixel circuits 10 and the electric circuits 20. For example, the angle formed by the direction of an alignment of rows of the electric circuits 20 and the direction of an alignment of rows of the pixel circuits 10 may be in a range of −30 to +30 degrees and may be typically equal to 0 degrees. The direction of an alignment of rows of the electric circuits 20 orthogonal to the direction of an alignment of rows of the pixel circuits 10 may increase an unnecessary wiring path between pixel circuits 10 and electric circuits 20, which should be avoided.

The electric circuits 20 of the v-th column include the p-th row electric circuit 20(p, v), the q-th row electric circuit 20(q, v), the r-th row electric circuit 20(r, v), and the s-th row electric circuit 20(s, v). The electric circuits 20 of the w-th column include the p-th row electric circuit 20(p, w), the q-th row electric circuit 20(q, w), the r-th row electric circuit 20(r, w), and the s-th row electric circuit 20(s, w).

Each of a plurality of pixel circuits 10 is connected to one of a plurality of electric circuits 20. The wiring structure 12 has a plurality of conductive portions (not illustrated), and the wiring structure 22 has a plurality of conductive portions. The conductive portions of the wiring structure 12 and the conductive portions of the wiring structure 22 are bonded so that each of the plurality of pixel circuits 10 can be electrically connected to the plurality of electric circuits 20 through the conductive portions of the wiring structure 12 and the conductive portions of the wiring structure 22.

A set of the pixel circuits 10 connected to an identical electric circuit 20 is called a pixel group 15. According to this example, the pixel group 15 includes J pixel circuit 10. In one pixel group 15, all pixel circuits 10 belonging to the one pixel group 15 are connected to an identical electric circuit 20. Pixel circuits 10 not included in the pixel groups 15 other than the pixel group 15 are not connected to the identical electric circuit 20. According to this embodiment, a plurality of pixel circuits 10 of pixel circuits 10 of an identical column is included in a pixel group 15. According to this embodiment, all pixel circuits 10 of an identical column belong to one pixel group 15. For example, all pixel circuits 10 of the e1-th column belong to the pixel group 15e1. Referring to FIG. 2A, the pixel group 15 included in the pixel circuit 10 of the β-th column is represented by a pixel group 15β (where β is e1, f1, e2 or the like).

FIG. 2B illustrates each of the electric circuits 20 is connected to which pixel group 15 of a plurality of pixel groups 15 corresponding to the electric circuits 20. For example, the electric circuit 20(p, v) is connected to the pixel group 15e1, and the electric circuit 20(q, v) is connected to the pixel group 15f1. The electric circuit 20(r, v) is connected to the pixel group 15g1, and the electric circuit 20(s, v) is connected to the pixel group 15h1. For example, the electric circuit 20(p, w) is connected to the pixel group 15e2, electric circuit 20(q, w) is connected to the pixel group 15f2. The electric circuit 20(r, w) is connected to the pixel group 15g2, and the electric circuit 20(s, w) is connected to the pixel group 15h2. For example, the electric circuit 20(p, x) is connected to the pixel group 15e3, and the electric circuit 20(q, x) is connected to the pixel group 15f3. The electric circuit 20(r, x) is connected to the pixel group 15g3, and the electric circuit 20(s, x) is connected to the pixel group 15h3.

In the examples illustrated in FIGS. 2A and 2B, all pixel circuits 10 of an identical column belong to an identical pixel group 15. Thus, the all pixel circuits 10 of the e1-th column are connected to the electric circuit 20(p, v), and all pixel circuits 10 of the f1-th column are connected to the electric circuit 20(q, v). All pixel circuits 10 of the g1-th column are connected to the electric circuit 20(r, v), and all pixel circuits 10 of the h1-th column are connected to the electric circuit 20(s, v). All pixel circuits 10 of the e2-th column are connected to the electric circuit 20(p, w), and all pixel circuits 10 of the f2-th column are connected to the electric circuit 20(q, w). All pixel circuits 10 of the g2-th column are connected to the electric circuit 20(r, w), and all pixel circuits 10 of the h2-th column are connected to the electric circuit 20(s, w). All pixel circuits 10 of the e3-th column are connected to the electric circuit 20(*p, x*), all pixel circuits 10 of the f3-th column are connected to the electric circuit 20(*q, x*). All pixel circuits 10 of the g3-th column are connected to the electric circuit 20(*r, x*), and all pixel circuits 10 of the h3-th column are connected to the electric circuit 20(*s, x*).

In this embodiment, because e1<f1<g1<h1, p<q<r<s, for the electric circuit 20 with an identical column number, as the column number of the pixel circuit 10 increases, the row number of the electric circuit 20 to be connected increases.

Because h1<e2, as the column number of the pixel circuits 10 increases (from the h1-th column to the e2-th column), the column number of the electric circuits 20 to be connected changes (from the v-th column to the w-th column). The column number of the pixel circuits 10 allocated to an identical column electric circuits 20 is e2−e1, which is equal to the row number T (T=e2−e1) of the electric circuits 20 included in the identical column. In other words, for each number of columns of pixel circuits 10 equal to T, the columns of the electric circuits 20 to be connected change.

According to this embodiment, pixel circuits 10 for T−1 columns exist between two pixel circuits 10 (such as the e1-th column and the e2-th column) connecting to electric circuits 20 of an identical row (such as the pth) and neighboring column (such as the v-th row and the w-th row). The pixel circuits 10 of K columns are allocated to one of electric circuits 20 of each column. Therefore, T×U=K. In order to increase the degree of parallelism of signal processing. J≤K is favorable. Therefore, J≤T×U. Because T<J, U<K, T×U<J×K. Therefore, T×U−K<J×K−T×U is satisfied. Deforming this, T×U<(J+1)×K/2. Therefore, because J+1≈J, T×U<J×K/2. Therefore, when the connection method according to this embodiment is adopted, it is favorable to satisfy J≤T×U<J×K/2.

Figure 3:
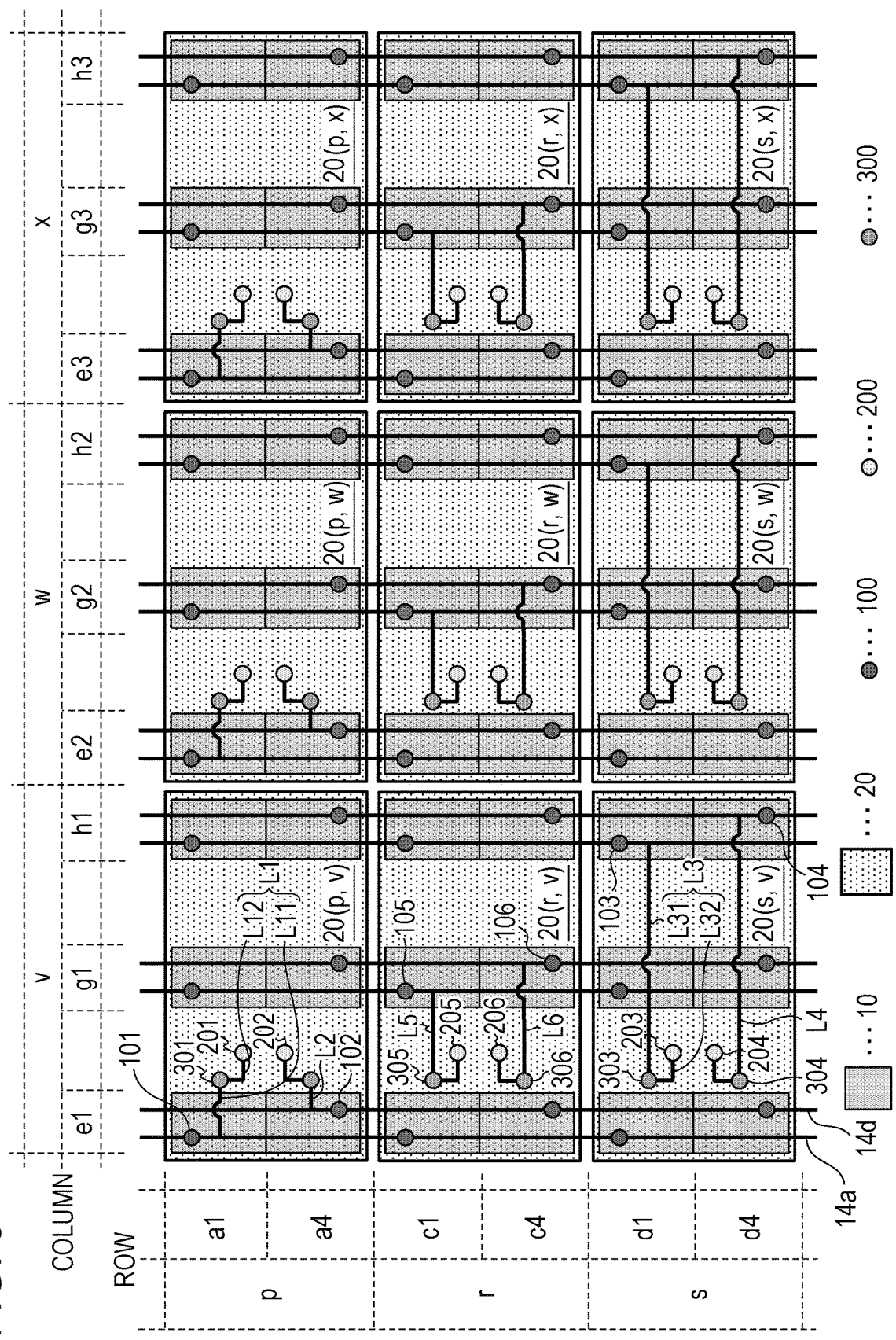
FIG. 3 is a schematic diagram illustrating a semiconductor apparatus.

FIG. 3 illustrates a planer positional relationship of the pixel circuits 10 and the electric circuits 20. FIG. 3 illustrates a plurality of semiconductor elements 100 configuring a plurality of pixel circuits 10 and a plurality of semiconductor elements 200 configuring a plurality of electric circuits 20. It should be noted that, referring to FIG. 3, specific semiconductor elements 101 to 106 of the semiconductor elements 100 and specific semiconductor element 201 to 206 of the semiconductor elements 200 are illustrated. Each of the plurality of semiconductor elements 100 is electrically connected to any one of the plurality of semiconductor elements 200 through a connecting unit 300. Referring to FIG. 3, specific connecting units 301 to 306 of the plurality of connecting unit 300 are illustrated which connects the semiconductor elements 101 to 106 and the semiconductor elements 201 to 206.

Referring to FIG. 3, the planer positional relationship between the semiconductor element 100 and the semiconductor element 200 which is connected to the semiconductor element 100 through the connecting unit 300 varies in accordance with the electric circuit 20. More Details thereof will be described below. The semiconductor element 201 configures an electric circuit 20(*p, v*) of the plurality of electric circuits 20. The semiconductor element 201 is electrically connected to at least the semiconductor element 101 of the plurality of semiconductor elements 100 configuring a plurality of pixel circuits 10 through the connecting unit 301 configuring a wiring structure 12 and a wiring structure 22. The semiconductor element 203 configures an electric circuit 20(*s, v*) of the plurality of electric circuits 20. The semiconductor element 203 is electrically connected to at least a semiconductor element 101 of the plurality of semiconductor elements 100 configuring a plurality of pixel circuits 10 through the connecting unit 303 configured by the wiring structure 12 and wiring structure 22. A shortest distance D1 (not illustrated) is from the semiconductor element 201 to the semiconductor element 201 connected to the connecting unit 301 of the plurality of semiconductor elements 100 configuring a plurality of pixel circuits 10. A shortest distance D3 (not illustrated) is from the semiconductor element 203 to the semiconductor element 103 connected to the connecting unit 303 of the plurality of semiconductor elements 100 configuring a plurality of pixel circuits 10. The distance D3 is longer than the distance D1 (D1<D3). The term "distance" here refers to a straight line distance. Although the semiconductor element 100 of the pixel circuit 10(*c* 1, e 1) is also connected to the connecting unit 301, the semiconductor element 100 is not a semiconductor element 100 positioned at a shortest distance from the semiconductor element 201. Also, for example, the distance between the semiconductor element 102 and the semiconductor element 202 is different from the distance between the semiconductor element 104 and the semiconductor element 204. The distance between the semiconductor element 105 and the semiconductor element 205 has a value between the distance D1 and the distance D3.

FIG. 3 illustrates thick lines representing wiring paths between the semiconductor elements 100 and the semiconductor elements 200. The wiring paths connecting the semiconductor elements 100 and the semiconductor elements 200 can be divided into wiring paths connecting the semiconductor elements 100 and the connecting units 300 and the wiring paths connecting the connecting units 300 and the semiconductor elements 200.

Referring to FIG. 3, the wiring paths through the connecting units 300 between the semiconductor element 100 and the semiconductor elements 200 schematically represent an actual magnitude relationship of lengths of the wiring paths. The following description will focus on the wiring path between electric circuits 20(*p, v*), 20(*r, v*), 20(*s, v*) of the v-th column and the pixel circuits 10 connected to the electric circuits 20(*p, v*), 20(*r, v*), 20(*s*, v) of the v-th column. The shortest length of the wiring path between one semiconductor element 100 and one semiconductor element 200 differs among pixel circuits 10 and among electric circuits 20. FIG. 3 illustrates a shortest length L1 of the wiring path between the semiconductor element 101 of a pixel circuit 10(*a*1, e1) and the semiconductor element 201 of an electric circuit 20(*p, v*).

It should be noted that the semiconductor element 100 of a pixel circuit 10(*c* 1, e 1) is also connected to the semiconductor element 201 through the signal line 14*a*. However, the wiring path between the semiconductor element 100 of the pixel circuit 10(*a*1, e1) and the semiconductor element 201 is longer than the wiring path between the semiconductor element 101 of the pixel circuit 10(*a*1, e1) and the semiconductor element 201 of the electric circuit 20(*p, v*). Therefore, the wiring path between the semiconductor element 100 of the pixel circuit 10(*c*1, e1) and the semiconductor element 201 is not the shortest wiring path between the semiconductor element 100 of the pixel circuit 10 and the semiconductor element 201. The following descriptions specify the shortest wiring paths in the same manner.

FIG. 3 illustrates a shortest length L2 of the wiring path between the semiconductor element 102 of the pixel circuit 10(*a*4, e1) and the semiconductor element 202 of the electric circuit 20(*p, v*). A length L3 is a shortest wiring path between the semiconductor element 103 of the pixel circuit 10(*d*1, h1) and the semiconductor element 203 of the electric circuit 20($s, v$). A length L4 is a shortest wiring path between the semiconductor element 104 of the pixel circuit 10($d$1, h1) and the semiconductor element 204 of the electric circuit 20($s, v$).

The length L3 and length L4 are longer than the length L1 and length L2 (L1, L2<L3, L4). The differentiation of the lengths of the wiring paths between the pixel circuits 10 and the electric circuits 20 among the electric circuits 20 can increase the degree of freedom of the layout of the pixel circuits 10 and the electric circuits 20. Particularly, the adoption of longer wiring paths enables placement of the semiconductor elements 200 of the electric circuits 20 at farther positions from the semiconductor elements 100 of the pixel circuits 10. Longer wiring paths may largely contribute to increases of the degrees of freedom of the layouts of the pixel circuits 10 and layouts of the electric circuits 20.

Other methods may be considered than the differentiation of lengths of wiring paths. For example, layouts within the electric circuits 20 can be differentiated among electric circuits 20 so that the semiconductor elements 200 can be placed at different positions among the electric circuit 20. However, it may cause a concern that the electric circuit 20 may have different properties from each other. Individually designing several tens to several thousands electric circuits 20 may cause disadvantages in design costs and design time periods. The electric circuit 20 may be displaced column by column of the pixel circuits 10. However, it may complicate and increase the length of the global wiring for connecting a plurality of electric circuits 20 in common, not expecting great advantages. Like this embodiment, compensation with local wiring may be advantageous for planer differences in positions of the semiconductor elements 100 in the pixel circuits 10 and the positions of the semiconductor element 200 in the electric circuits 20.

The length L2 is lower than the length L1 (L2<L1). The length L4 is larger than the length L3 (L3<L4). The differentiation of the lengths of the wiring paths between the pixel circuits 10 and the electric circuits 20 among the pixel circuits 10 can increase the degree of freedom of the layout of the pixel circuits 10 and the electric circuits 20. Particularly, the adoption of longer wiring paths enables placement of the semiconductor elements 200 of the electric circuits 20 at farther positions from the semiconductor elements 100 of the pixel circuits 10. Longer wiring paths may largely contribute to increases of the degrees of freedom of the layouts of the pixel circuits 10 and layouts of the electric circuits 20.

FIG. 3 illustrates a shortest length L5 of the wiring path between the semiconductor element 105 of the pixel circuit 10($c$ 1, g 1) and the semiconductor element 205 in the electric circuit 20($r, v$). A length L6 is a shortest wiring path between the semiconductor element 106 in the pixel circuit 10($c$4, g1) and the semiconductor element 206 in the electric circuit 20($r, v$). The lengths L5 and L6 are lengths between the lengths L1, L2 and the lengths L3, L4 (L1, L2<L5, L6<L3, L4). Three or more lengths of the wiring paths can reduce difference in electric property due to differences in length of wiring paths between adjacent electric circuits 20. Increases of the lengths of wiring path as the row goes can simplify the correction algorithm with signal processing to be applied against differences in electric property between electric circuits 20.

Having described regarding the electric circuits 20 of the v-th column up to this point, the same is also true for the wiring paths of the electric circuits 20 in the w-th column, the x-th column for easy understanding from FIG. 3.

Figure 4:
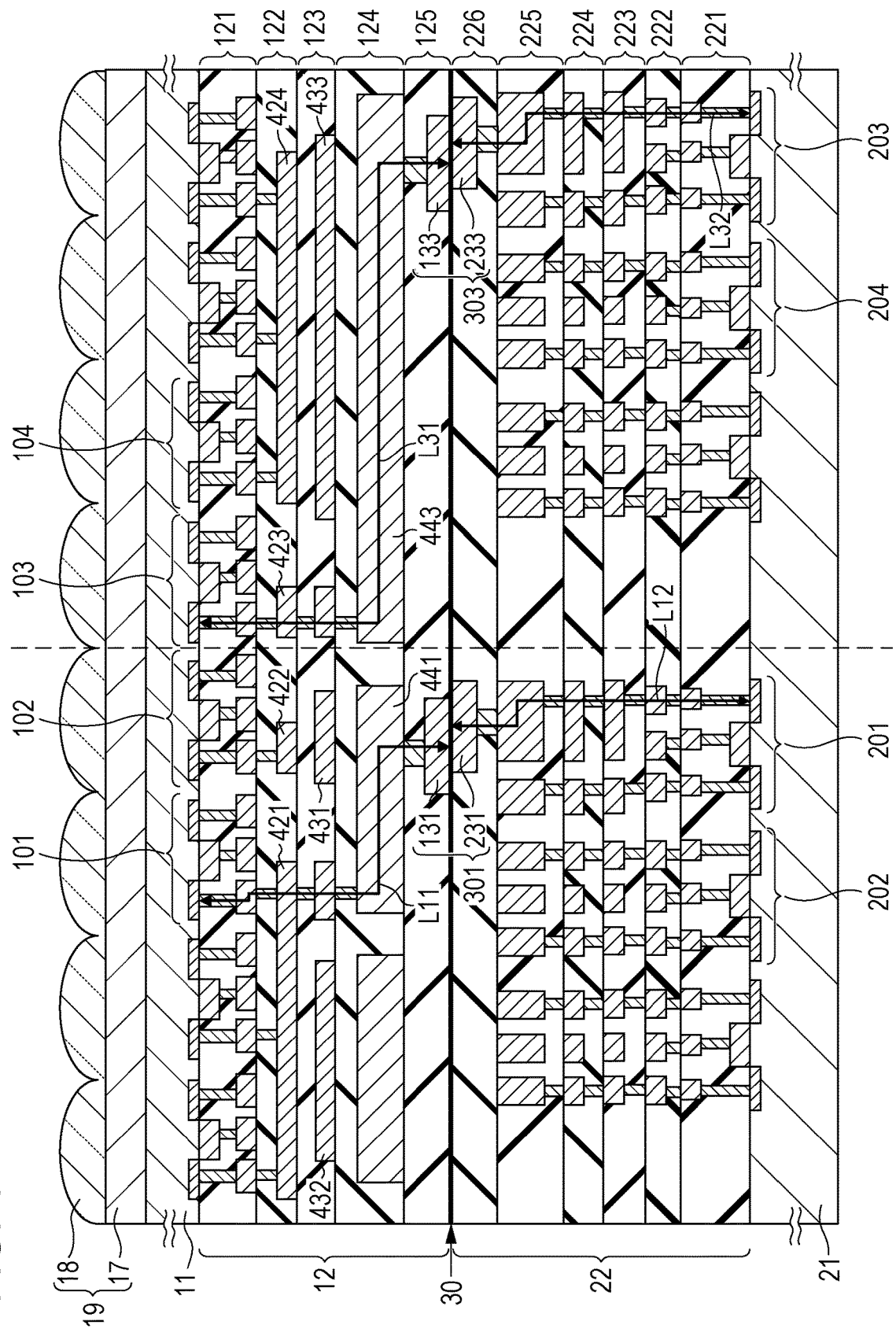
FIG. 4 is a schematic diagram illustrating a semiconductor apparatus.

The wiring paths will be described in more detail below. FIG. 4 is a cross sectional view of a semiconductor apparatus APR. The wiring structure 12 includes five (M) wiring layers. The five (M) wiring layers are, from the semiconductor layer 11, a first wiring layer 121, a second (mth) wiring layer 122, a third ((m+v)th; m<m+v<m+µ) wiring layer 123, a fourth ((m+µ)th; m+µ>m) wiring layer 124, and a fifth (mth) wiring layer 125.

The wiring structure 22 includes six (N) wiring layers. The six (N) wiring layers are, from the semiconductor layer 21, a first wiring layer 221, a second wiring layer 222, a third (nth) wiring layer 223, a fourth ((N−2)th) wiring layer 224, a fifth ((N−1)th) wiring layer 225, and a sixth (nth) wiring layer 225.

The conductive portions 131 and 133 are included in the M-th wiring layer 125 from the semiconductor layer 11 of the wiring structure 12 and are connected to an arbitrary pixel circuit 10($\alpha, \beta$) of a plurality of pixel circuits 10 via the wiring structure 12. The conductive portions 231 and 233 are included in the N-th wiring layer 226 from the semiconductor layer 21 of the wiring structure 22 and are connected to an arbitrary electric circuit 20($\gamma, \delta$) of a plurality of electric circuits 20 via the wiring structure 22. The conductive portion 131 and the conductive portion 231 are electrically connected, and the conductive portion 133 and the conductive portion 233 are electrically connected. The connecting unit 301 includes a combination of the conductive portion 131 and the conductive portion 231, and the connecting unit 303 is a combination of the conductive portion 133 and the conductive portion 233. The same is also true for other connecting units 300, and a conductive portion in the wiring structure 12 and a conductive portion in the wiring structure 22 are electrically connected therein. According to this embodiment, the chip 1 and the chip 2 are bonded via a bonded surface 30. More specifically, the conductive portions 131, 133 and the conductive portions 231 and 233 mainly contain copper, and the copper of the conductive portion 231 and the copper of the conductive portion 131 are bonded via the bonded surface 30, and the copper of the conductive portion 133 and the copper of the conductive portion 233 are bonded via the bonded surface 30. Each of the conductive portions 131 and 133 are embedded in recesses of the interlayer insulating film of the wiring structure 12 and has a damascene structure (or a dural damascene structure in this embodiment). Each of the conductive portions 231 and 233 is embedded in recesses of the interlayer insulating film of the wiring structure 22 and has a damascene structure (or a dual damascene structure in this embodiment). The conductive portions 131, 133 and the conductive portions 231, 233 are not only bonded, but the interlayer insulating film having the conductive portions 131 and 133 therein and the interlayer insulating film having the conductive portions 231 and 233 therein are also bonded via the bonded surface 30. In this embodiment, at the bonded surface 30, the conductive portions 131 and 133 face the interlayer insulating films having the conductive portions 231 and 233 therein. In a case where the conductive portion 131 and the conductive portion 231 are in contact with each other for the bonding, the position of the connecting unit 301 can be fitted to the position at the bonded surface 30 between the conductive portion 131 and the conductive portion 231. In a case where the conductive portion 133 and the conductive portion 233 are in contact with each other for the bonding, the position of the connecting unit 303 can be fitted to the position at the bonded surface 30 between the conductive portion 133 and the conductive portion 233. In a case where the M-th wiring layer 125 and the N-th wiring layer 226 are not in contact with each other, a wiring layer which configures neither the pixel circuit 10 nor the electric circuit 20 can be placed between the M-th wiring layer 125 and the N-th wiring layer 226.

Alternatively, the conductive portions 131 and 133 and the conductive portions 231 and 233 can be electrically connected through bumps placed between the conductive portion 131 and the conductive portion 231 and the conductive portion 133 and the conductive portion 233. Further alternatively, the conductive portions 131 and 133 and the conductive portions 231 and 233 can be connected through a penetrate electrode configured to penetrate the semiconductor layer 21. In all of the configurations, the conductive portion 131 and conductive portion 231 are positioned between the semiconductor layer 11 and the electric circuit 20(p, v). The conductive portion 133 and conductive portion 233 are positioned between the semiconductor layer 11 and the electric circuit 20(s, v).

As illustrated in FIG. 3, the connecting unit 300 has a similar relative positional relationship in each of the electric circuits 20. For example, the direction of an alignment of connecting units 301 to 306 included in the plurality of electric circuits 20 is along the directions of alignments of rows of and columns of the pixel circuits 10 and the directions of alignments of rows and columns of the electric circuits 20. In a case where a conductive portion included in the connecting unit 300 has a damascene structure, a CMP method may be used for forming the connecting unit. In order to reduce polishing unevenness due to the CMP (chemical-mechanical polishing) method, a plurality of connecting unit 300 may be placed uniformly as much as possible in the bonded surface 30 of the chips 1 and 2. This is because the positions of the connecting unit 300 are placed along rows and columns according to this embodiment.

The semiconductor elements 100, 200 are transistors each having a source/drain and a gate but may be diodes. The conductive portions 131 and 133 of the semiconductor elements 100 and 200 can be connected at the sources/drains or the gates of the semiconductor elements 100 and 200. Alternatively, the semiconductor elements 100 and 200 may be MIS type capacitor elements or resistor elements containing polysilicon or single-crystal silicon.

The transistor to be used for the electric circuit 20 may have a silicide layer containing cobaltsilicide or nickel silicide, for example. The gate electrode may be a Metal gate, and the gate insulating film may be a high-k insulating film. The transistor to be used for the electric circuit 20 may be a planer MOSFET but may be a Fin-FET. The gate insulating films of the transistors provided in the semiconductor layer 21 may have a plurality of types of thicknesses. AA transistor having a thick gate insulating film may be used in a circuit desirably having a high-withstand voltage such as a power supply system or an analog system. The interlayer insulating films in the wiring layers 125 and 226 may be a monolayer such as a silicon oxide layer, a silicon nitride layer, a silicon carbide or a multilayer thereof. Low-k insulating layers can be used for the interlayer insulating film in the wiring layers 122, 123, 124 and wiring layers 222, 223, 224, 225. The silicon oxide layers of the interlayer insulating films of the wiring layer 125, 226 including the conductive portions 131 and 133, 231, 232 may have a carbon concentration lower than a carbon concentration of the interlayer insulating film silicon oxide of the wiring layers 122, 123, 124 or the wiring layers 222, 223, 224, 225. This can increase the strength of the bonding between the chips 1 and 2.

The semiconductor layer 11 includes a photoelectric converting unit (not illustrated) for a photodiode, for example, included in the pixel circuit 10. Referring to FIG. 4, an optical structure 19 is provided on the semiconductor layer 11 and on the opposite side of the wiring structure 12 about the semiconductor layer 11 and includes a color filter array 17 and/or a microlens array 18. Thus, the semiconductor layer 11 has a so-called back side irradiation type structure. The semiconductor layer 11 may have a thickness in a range of 1 to 10 μm, for example, and is thinner than the semiconductor layer 21 having a thickness in a range of 50 to 800 μm, for example.

A length L11 is a shortest length of a wiring path from the conductive portion 231 to a plurality of semiconductor elements 100 included in a plurality of pixel circuits 10. Here, the shortest wiring path length can be from the conductive portion 231 to the semiconductor element 101. A length L12 is a shortest length of a wiring path from the conductive portion 131 to a plurality of semiconductor elements 200 included in a plurality of electric circuits 20. Here, the shortest wiring path length is from the conductive portion 231 to the semiconductor element 201. The length L1 substantially corresponds to a sum of L11 and L12 (L1=L11+L12). A length L31 is a shortest length of a wiring path from the conductive portion 233 to a plurality of semiconductor elements 100 included in a plurality of pixel circuits 10. The shortest wiring path length is from the conductive portion 231 to the semiconductor element 103. A length L32 is a shortest length of a wiring path from the conductive portion 133 to a plurality of semiconductor elements 200 included in a plurality of electric circuits 20. The shortest wiring path length is from the conductive portion 231 to the semiconductor element 203. The length L3 substantially corresponds to a sum of L31 and L32 (L3=L31+L32).

Calculating the length L11 from the conductive portion 231 as a starting point and calculating the length L12 from the conductive portion 131 as a starting point may result in a wiring path length which may possibly include an overlapping connection distance between the conductive portion 131 and the conductive portion 133. However, the connection distance between the conductive portion 131 and the conductive portion 133 can be cancelled in the comparison between the wiring path lengths. According to this example, because the connection distance between the conductive portions 131 and 133 and the connection distance between the conductive portions 231 and 233 are equal to 0, the overlapping does not have any influence thereon. The overlapping may have an influence in a case where another conductive member such as a bump is interposed between the conductive portions 131 and 133 and the conductive portions 231 and 233.

With respect to the mutually connected conductive portion 131 and conductive portion 231, the length L11 of the wiring path from the conductive portion 231 to the semiconductor element 100 is longer than the length L12 of the wiring path from the conductive portion 131 to the semiconductor element 200 (L11>L12). Also, with respect to the mutually connected conductive portion 133 and conductive portion 233, the length L31 of the wiring path from the conductive portion 233 to the semiconductor element 100 is longer than the length L32 of the wiring path from the conductive portion 133 to the semiconductor element 200 (L31>L32). It should be noted that the length L2 of the wiring path from the connecting unit 302 to the semiconductor element 102 is equal to or shorter than the length of the wiring path from the connecting unit 302 to the semiconductor element 202. Furthermore, according to this embodiment, the length L31 is longer than length L12 (L12<L31). The length L11 is longer than the length L32 (L32<L11).

Preferably, the length of the wiring path of the connecting unit 300 is longer on the wiring structure 22 side about the connecting unit 300 than that on the wiring structure 12 side. More specifically, a wire for extending the wiring path may be provided in the wiring structure 12. The extended wiring path may increase noise mixed in the wiring. However, a wire for extending the wiring path provided in the wiring structure 12 can increase the wiring path on the wiring structure 22 side, which can separate the wiring from the electric circuit 20 that is a noise source. This can prevent the noise occurring in the wiring path between the semiconductor element 100 and the semiconductor element 200.

In order to reduce variations in property among the electric circuits 20, variations in positional relationship of the semiconductor elements 200 among the electric circuit 20 may be reduced. As the variations in positional relationship of the semiconductor element 200 among electric circuits 20 increases, variations in property due to different layouts within the electric circuits 20 can increase. This embodiment assumes that the positional relationships of semiconductor elements 200 in the electric circuits 20 are the same among electric circuits 20. The wiring path from the connecting unit 300 to the semiconductor element 200 is as short as possible. According to this embodiment, length L31 is longer than length L12 (L12<L31). The length L11 is longer than the length L32 (L32<L11). The length L12 is equal to the length L32 (L12=L32). This can reduce property variations among electric circuits 20 due to the wiring path lengths from the connecting units 300 to semiconductor elements 200. For different wiring paths between the pixel circuits 10 and the electric circuits 20, the wiring paths on the chip 1 side may be differentiated among the connecting units 300 and the wiring paths on the chip 2 side may be differentiated among the connecting units 300. This may cause larger variations among wiring paths and may increase its design loads. The wiring paths of one of the chip 1 side and the chip 2 side should be as simple as possible and should not vary largely among the connecting units 300 for enhanced performance and prevention of increases of the design loads.

The wire for extending a wiring path can be included in a wiring structure having a lower number of wiring layers between the wiring structure 12 and the wiring structure 22. The wiring structure 12 and the wiring structure 22 may have an equal number of wiring layers as a result of addition of a wiring layer for an extended wiring path. A wiring layer for an extended wiring path included in a wiring structure having more wiring layers of the wiring structure 12 and the wiring structure 22 may possibly reduce yields or may possibly increase costs. A wiring structure having a fewer wiring layers between the wiring structure 12 and the wiring structure 22 can prevent such reduction of yields or such increases of costs even when a wire is added for an extended wiring path.

Summarizing these points, if L12<L11 and L32<L31, the number (M) of wiring layers of the wiring structure 12 may be equal to or lower than the number (N) of wiring layers of the wiring structure 22 (M≤N). The number (M) of wiring layers of the wiring structure 12 may be lower than the number (N) of wiring layers of the wiring structure 22 (M<N).

In the configuration illustrated in FIG. 4, common lines 421, 422, 423, 424 common connected to two or more pixel circuits of a plurality of pixel circuits include the second (mth) wiring layer 122. Each of the common lines 421, 422, 423, 424 is connected to a plurality of pixel circuits 10 of different rows from each other. The common line 421 may be included in the signal line 14a, for example, and the common line 422 may be included in the signal line 14d, for example. The common lines 421, 422, 423, 424 extend along an identical direction of an alignment of columns of the pixel circuits 10. FIG. 4 illustrates the common lines 421, 423 and extension lines 441, 443 connecting the conductive portions 131 and 133. The extension lines 441, 443 are wires provided for extending a wiring path between the common lines 421, 423 and the conductive portions 131 and 133. The wiring lengths of the extension line 441, 443 can occupy great parts of the lengths L11 and L13 and can occupy great parts of the lengths L1 and L3. In the configuration illustrated in FIG. 4, the extension lines 441 and 443 are included in the fourth ((m+µ)th; m+µ>m) wiring layer 124. For lower resistance of the extension lines 441 and 443 for extended wiring paths, they may be provided in an upper wiring layer having a thicker wiring width.

Shielding lines 431, 432, 433 are placed between the extension lines 441 and 443 and the common lines 422 and 424. The shielding lines 431, 432, 433 are wires configured to receive a fixed potential such as a ground potential pr a power supply potential. The shielding lines 431, 432, 433 are positioned between the fourth ((m+µ)th; m+µ>m) wiring layer 124 including the extension lines 441, 443 and the second (mth) wiring layer 122 including the common lines 422, 424. The shielding lines 431, 432, 433 are included in the third ((m+ν)th; m<m+ν<m+µ) wiring layer 123. The common line 421 and the common line 422 can communicate signals that are different from each other. Then, when the extension line 441 connected to the common line 421 is close to (such as intersecting with) the common line 422, crosstalk may be caused between a signal in the common line 421 and a signal in the common line 422. Accordingly, The shielding line 431 receiving a fixed potential may be placed between the extension line 441 and the common line 422 to prevent such crosstalk. Also, the shielding line 433 is placed between the extension line 443 connected to the common line 423 and the common line 424 so that crosstalk between a signal in the common line 423 and a signal in the common line 424 can be prevented.

Second Embodiment

Figure 5:
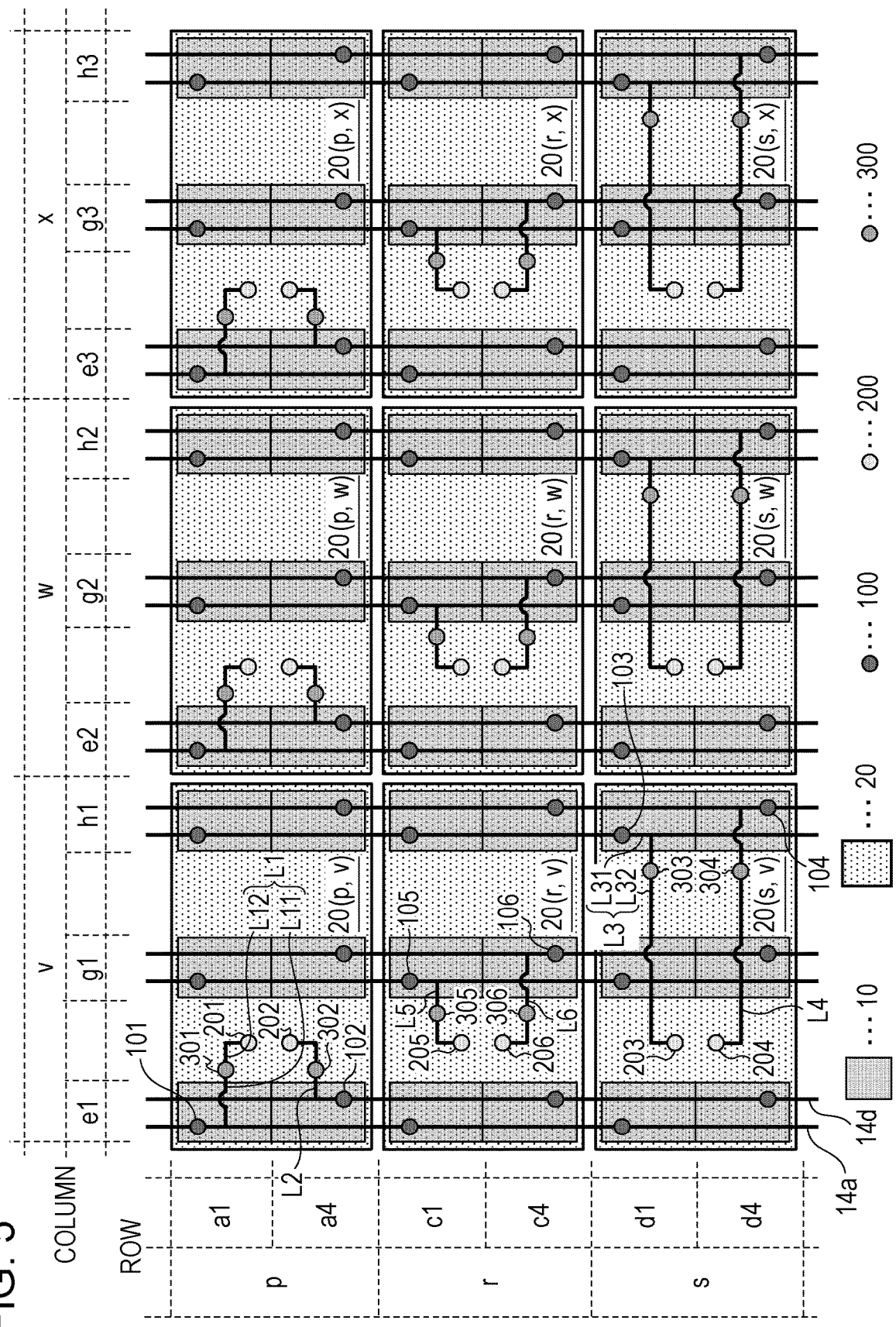
FIG. 5 is a schematic diagram illustrating a semiconductor apparatus.

A second embodiment will be described with reference to FIG. 5 by omitting any repetitive descriptions like parts in the first and second embodiment. For example, the first and second embodiments are the same in that the length L3 of the wiring path between the semiconductor element 103 and the semiconductor element 203 through the connecting unit 303 is longer than the length L1 of the wiring path between the semiconductor element 101 and the semiconductor element 201 through the connecting unit 301.

According to the first embodiment, the lengths (such as the lengths L12, L32) of the wiring paths from the connecting units 300 to the semiconductor elements 200 are equal among the electric circuits 20 (L12=L32). Conversely, according to the second embodiment, the lengths L12 and L32 are different among the electric circuits 20. For example, the length L32 may be longer than the length L12 (L12<L32). Thus, the connecting units 300 can be placed proper positions without restrictions of the positions of the semiconductor elements 200. As a result, the variations in property of the electric circuits 20 can be reduced. Optimized positions of the connecting units 300 can reduce uneven bonding among the connecting units 300, which can improve reliability of connections by the connecting units 300.

According to this embodiment, like the first embodiment, the length L11 is longer than the length L12 (L12<L11) of the wiring path between the semiconductor element 101 and the semiconductor element 201 through the connecting unit 301. Accordingly, an extension line 441 may be placed in the wiring structure 12. On the other hand, unlike the first embodiment, the length L32 is longer than the length L31 (L31<L32) of the wiring path between the semiconductor element 103 and the semiconductor element 203 through the connecting unit 303. Accordingly, not only the extension line 443 but also an extension line is also added to the wiring structure 22.

As another example of the connections between the pixel circuits 10 and the electric circuits 20 which is applicable to the first embodiment and the second embodiment, it may be configured that as the column of the pixel circuit 10 of a part of columns of the electric circuits 20 increases, the row number of the electric circuit 20 to be connected decreases. For example, the pixel circuits 10 of the e2-th column can be connected to the electric circuit (s, w), and the pixel circuits 10 of the h2-th column can be connected to the electric circuit (p, w). Then, the pixel circuits 10 of the f2-th column can be connected to the electric circuit (r, w), and the pixel circuits 10 of the g2-th column can be connected to the electric circuit (q, w). Thus, the electric circuit 20(s, v) and the electric circuit 20(s, w) of an identical row can be adjacent to each other to which the pixel circuits 10 of adjacent columns (such as the h1-th column and the e2-th column) are connected. Thus, signal processing in the adjacent columns of the pixel circuits 10 can be performed in the respective electric circuits 20 having a small property difference. Thus, signals corresponding to the pixel circuits 10 of the adjacent columns can have a small output difference. The property difference among the electric circuits 20 may depend on differences in length of the wiring path between the semiconductor elements 100 and the semiconductor elements 200. Therefore, the difference in length of the wiring paths between the semiconductor elements 100 and semiconductor elements 200 may be as small as possible in the two columns of close pixel circuits 10.

Third Embodiment

Figure 6A:
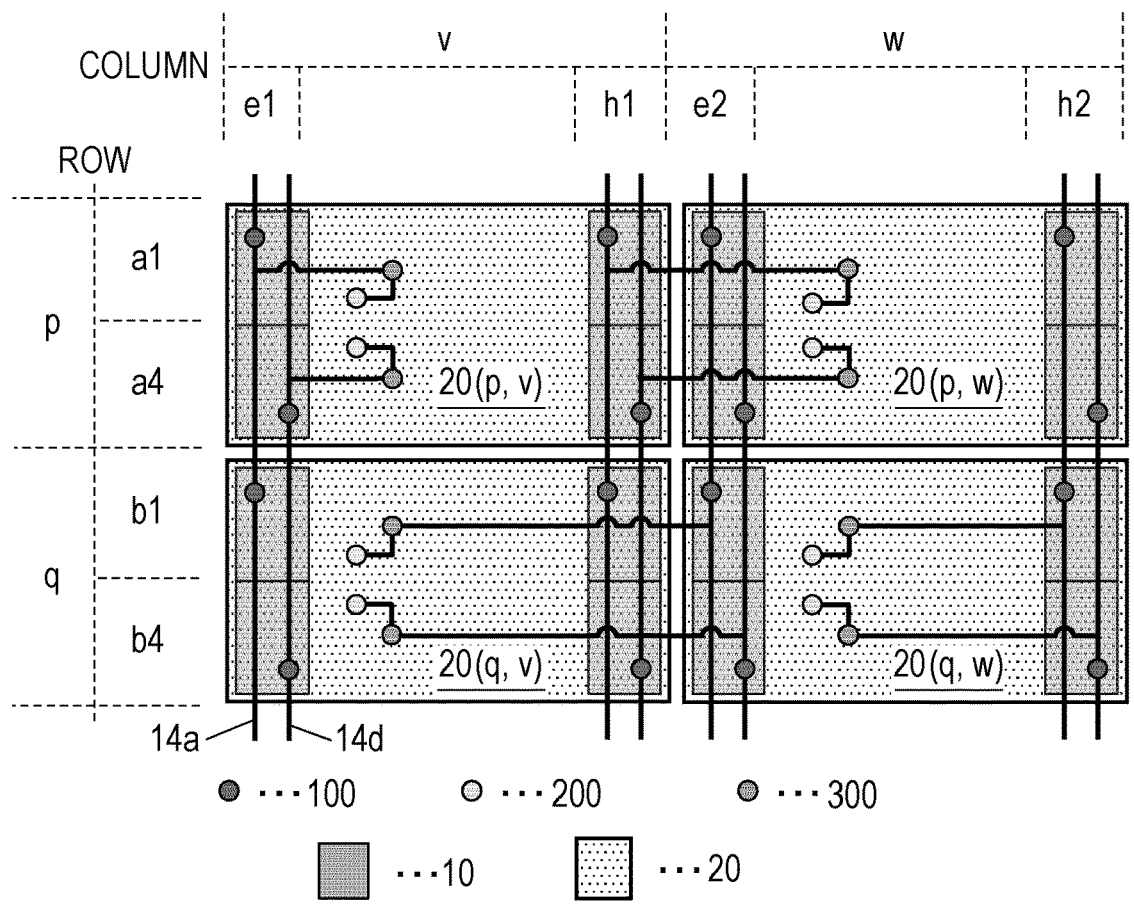
FIGS. 6A and 6B are schematic diagrams illustrating a semiconductor apparatus.

With reference to FIG. 6A, a third embodiment will be described. The third embodiment is different from the first and second embodiments in connection relationships between the pixel circuits 10 and the electric circuit 20.

Referring to FIG. 6A, according to this embodiment, a plurality of pixel circuits 10 and a plurality of electric circuits 20 have the following connection relationship. The pixel circuits 10 of the e1-th column are connected to the electric circuit 20(p, v), and the pixel circuits 10 of the h1-th column are connected to the electric circuit 20(p, w). The pixel circuits 10 of the e2-th column is connected to the electric circuit 20(q, v), and the pixel circuits 10 of the h2-th column are connected to the electric circuit 20(q, w).

According to the first embodiment, the pixel circuits 10 from the e1-th column to the h1-th column are connected to electric circuits 20 of an identical column(the v-th column) but different rows (from the p-th row to the s-th row). The pixel circuits 10 from the e2-th column to the h2-th column are connected to the electric circuits 20 of an identical column(the w-th column) and different rows (the p-th row to the s-th row). On the other hand, according to the third embodiment, the pixel circuits 10 from the e1-th column to the h1-th column are connected to the electric circuits 20 of an identical row (the p-th row) but different columns (the v-th column, the w-th column) The pixel circuits 10 from the e2-th column to the h2-th column are connected to the electric circuits 20 of an identical row (the q-th row) and different columns (the v-th column, the w-th column) According to this embodiment, as the column number of the pixel circuit 10 increases, the column number of the corresponding electric circuit 20 increases. As a result, the distance between the pixel circuits 10 of the h1-th column and the electric circuits 20 of the w-th column can be long. However, like the first embodiment, the wiring path lengths L1, L2, L3, and L4 are different from each other. Therefore, such a connection relationship between the pixel circuits 10 and the electric circuits 20 can be achieved without greatly differentiating placements of the semiconductor elements 100 of the pixel circuits 10 and the semiconductor elements 200 of the electric circuits 20.

Fourth Embodiment

Figure 6B:
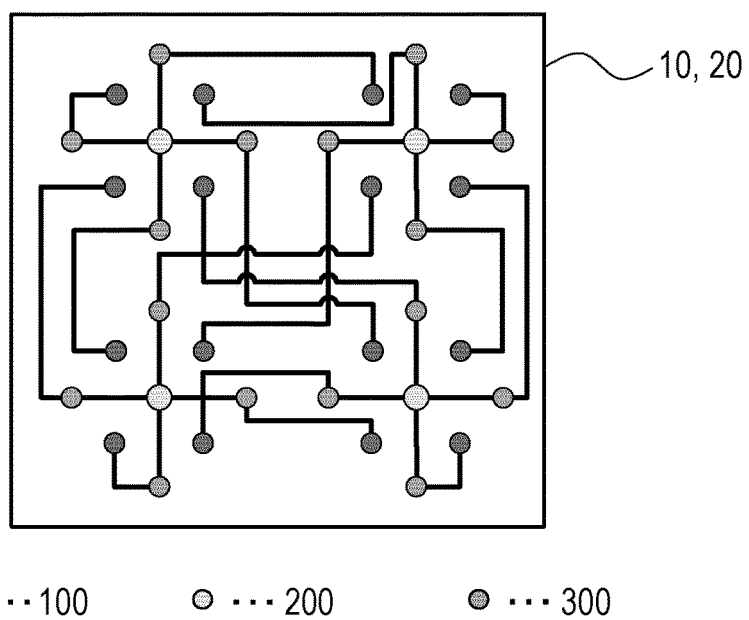

With reference to FIG. 6B, a fourth embodiment will be described. The fourth embodiment corresponds to another example of the method for connecting the pixel circuits 10 and the electric circuits 20. FIG. 6B schematically illustrates semiconductor elements 100 of the pixel circuits 10, semiconductor elements 200 of the electric circuits 20, and connecting units 300, a positional relationship thereof, and lengths of wiring paths therebetween. In this case, 16 semiconductor elements 100 are connected to four semiconductor elements 200 through 16 connecting units 300.

Also according to this embodiment, the lengths of the wiring paths from the semiconductor elements 100 of the pixel circuit 10 to the semiconductor elements 200 of the electric circuit 20 in one electric circuit 20 may differ. In one electric circuit 20, the lengths of the wiring paths from the semiconductor elements 100 in the pixel circuit 10 to the connecting units 300 may differ. In one electric circuit 20, the lengths of wiring paths from the connecting units 300 to the semiconductor elements 200 in the electric circuit 20 may differ.

In one electric circuit 20, there may be a mixture of a wiring path for communicating signals from the semiconductor elements 100 to the semiconductor elements 200 and a wiring path for communicating a signal from the semiconductor elements 200 to the semiconductor elements 100. A signal to be communicated from any one of the semiconductor elements 100 to the corresponding semiconductor element 200 may be a pixel signal output from the pixel circuit 10, for example, and can be processed in the electric circuit 20. A signal to be communicated from any one of the semiconductor elements 200 to the corresponding semiconductor element 100 may be a drive signal output from the electric circuit 20, for example, for driving the pixel circuit 10.

According to this embodiment, like the first embodiment, an extension line for extending a wiring path may be placed in the wiring structure 12 or may be partially placed in the wiring structure 22.

Fifth Embodiment

Figure 7:
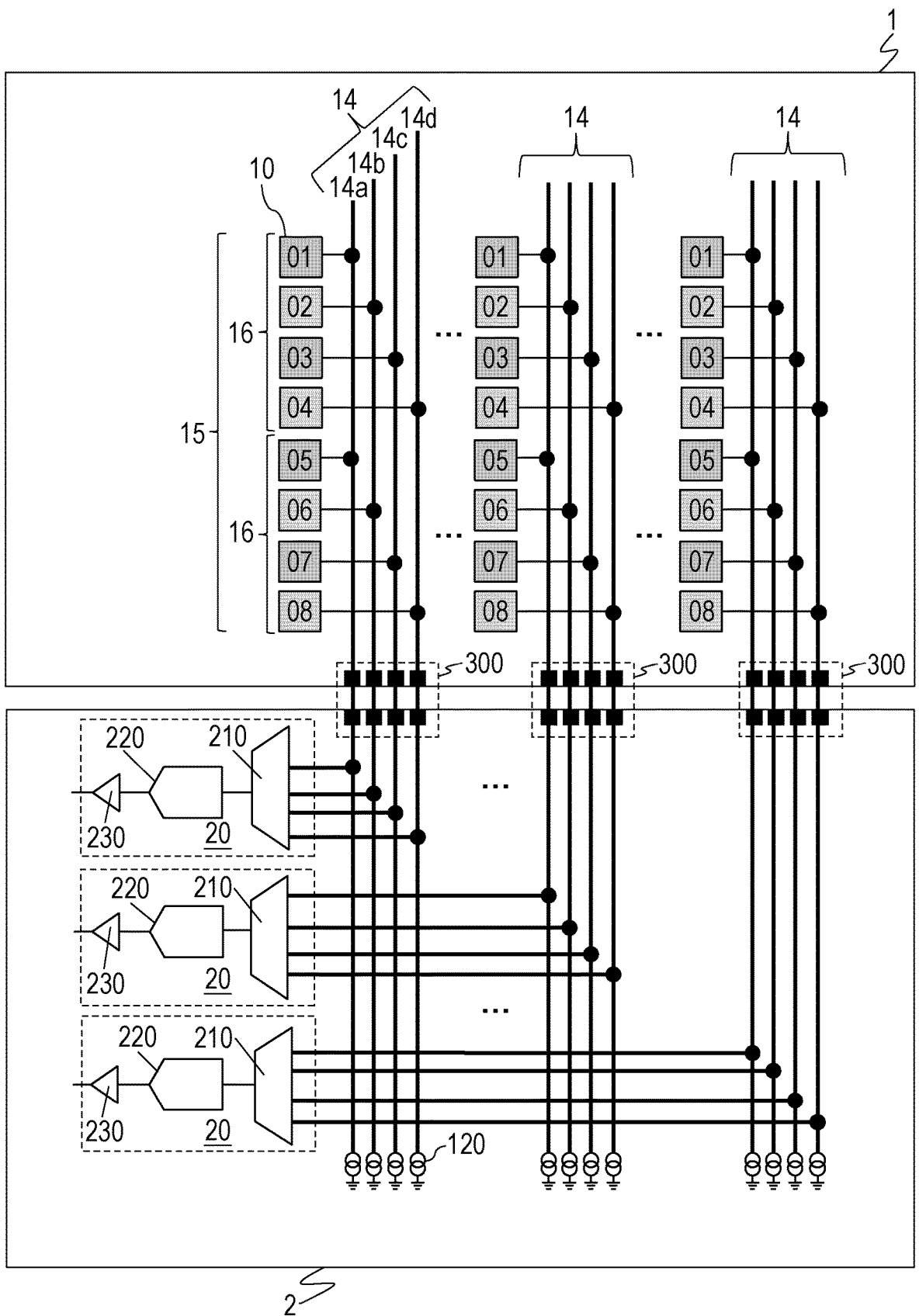
FIG. 7 is a schematic diagram illustrating a semiconductor apparatus.

This embodiment have a common configuration to those of the first to fourth embodiments. FIG. 7 illustrates an equivalent circuit of the semiconductor apparatus illustrated in FIGS. 1A and 1B and FIGS. 2A and 2B. FIG. 7 illustrates pixel circuits 10 of three columns of the pixel circuits 10 illustrated in FIGS. 2A and 2B and three electric circuits 20 for the pixel circuits 10 illustrated in FIGS. 2A and 2B.

The pixel circuit 10 of the chip 1 has four (X) signal lines 14a, 14b, 14c, 14d for pixel circuits 10 of one column. The signal lines 14a, 14b, 14c, and 14d can correspond to the common lines 421, 422, 423 and 424, respectively. The signal lines 14a, 14b, 14c, and 14d will collectively be called a signal line 14. The pixel circuits 10 of the first row (the a1-th row) are connected to the signal line 14a. The pixel circuits 10 of the second, third, and fourth rows are connected to the signal lines 14b, 14c, and 14d in the order. With respect to the pixel circuits 10 of the (λ+1)-th row and subsequent rows, the (ρ×λ+1)-th pixel circuit 10 (where ρ is a natural number) is connected to the signal line 14a. The pixel circuits 10 of the (ρ×λ+2)-th row, the (ρ×λ+3)-th row, and (ρ×λ+4)-th row are connected to the signal lines 14b, 14c, 14d in the order. In a case where one column has J pixels, J/λ pixel circuits 10 are connected to one signal line 14a in common. The same connection relationship between the pixel circuits 10 and the signal line 14 is also true in another column of the pixel circuits 10.

A set of λ continuously arranged pixel circuits 10 connected to mutually different λ signal lines will be called a pixel set 16. A group including a plurality of pixel sets 16 and (J) pixels of J rows will be called a pixel group 15. The pixel group 15 can include J rows of (J) pixels and J/λ pixel sets 16. To one pixel group 15, all (J) pixel circuits 10 belonging to the one pixel group 15 are connected to an identical electric circuit 20. To the identical electric circuit 20, pixel circuits 10 included in a pixel group 15 excluding the pixel group 15 are not connected.

A current source 120 is connected to the signal lines of the signal line 14. The current source 120 is configured to supply electric current to the signal lines of the signal line 14 via a connecting unit 300. Although the current source 120 is provided in the chip 2, it may be provided in the chip 1.

Each of the signal lines 14 is connected to the electric circuits 20 via the connecting unit 300. In the example in FIG. 7, the signal line 14 connecting to the pixel circuits 10 of the first column is connected to the first electric circuits 20. The signal line 14 connecting to the pixel circuits 10 of the second column is connected to the second electric circuit 20. The signal line 14 connecting to the pixel circuits 10 of the third column is connected to the third electric circuit 20.

The electric circuit 20 has an input unit 210, a main unit 220, and an output unit 230. The input unit 210 has at least λ input terminals. The λ signal lines 14a, 14b, 14c, and 14d included in the signal line 14 are connected to λ input terminals of the input unit 210. The main unit 220 is configured to process signals from the pixel circuit 10, for example. Therefore, the main unit 220 can be called a signal processing unit. The input unit 210 is configured to sequentially select the signal line 14a, 14b, 14c, and 14d of the signal line 14, and the main unit 220 is configured to sequentially process signals of the signal lines 14a, 14b, 14c, and 14d. The output unit 230 is configured to output a signal from the electric circuit 20.

FIG. 7 illustrates sequence numbers 01 to 08 for signals to be processed with respect to a plurality of pixel circuits 10. First, the first pixel set 16 is selected by a scanning circuit, not illustrated. For example, signals of pixel circuits 10 of the (ρ×λ+1)-th row, signals of pixel circuits 10 of the (ρ×λ+2)-th row, signals of pixel circuits 10 of the (ρ×λ+3)-th row, signals of pixel circuits 10 of the (ρ×λ+4)-th row are sequentially processed (sequence numbers 01 to 04). Next, the next pixel set 16 is selected by the scanning circuit, not illustrated. In other words, signals of pixel circuits 10 of ((ρ+1)×λ+1)-th row, signals of pixel circuits 10 of ((ρ+1)×λ+2)-th row, signals of pixel circuits 10 of ((ρ+1)×λ+3)-th row, signals of pixel circuits 10 of ((ρ+1)×λ+4)-th row are read out to the signal lines 14. Then, the input unit 210 and the main unit 220 sequentially process (sequence numbers 05 to 08) signals of pixel circuits 10 of ((ρ+1)×λ+2)-th row, signals of pixel circuits 10 of ((ρ+1)×λ+3)-th row, signals of pixel circuits 10 of ((ρ+1)×λ+4)-th row.

Signals from pixel circuits 10 of an identical row can be processed in parallel by a plurality of electric circuits 20 corresponding to the pixel circuits 10 of the columns. For example, signals from the pixel circuits 10 of the (ρ×λ+1)-th row to (ρ×λ+4)-th row can be processed in parallel between a plurality of electric circuit 20 of an identical column. Also, signals of pixel circuits 10 of the ((ρ+1)×λ+1)-th row to ((ρ+1)×λ+4)-th row can be processed in parallel among a plurality of electric circuit 20 of an identical column. The processing on signals from the pixel circuits 10 of the (ρ×λ+1)-th row to (ρ×λ+4)-th row is performed at a different time from the processing on the signals from the pixel circuits 10 of the ((ρ+1)×λ+1)-th row to ((ρ+1)×λ+4)-th row.

Figure 8:
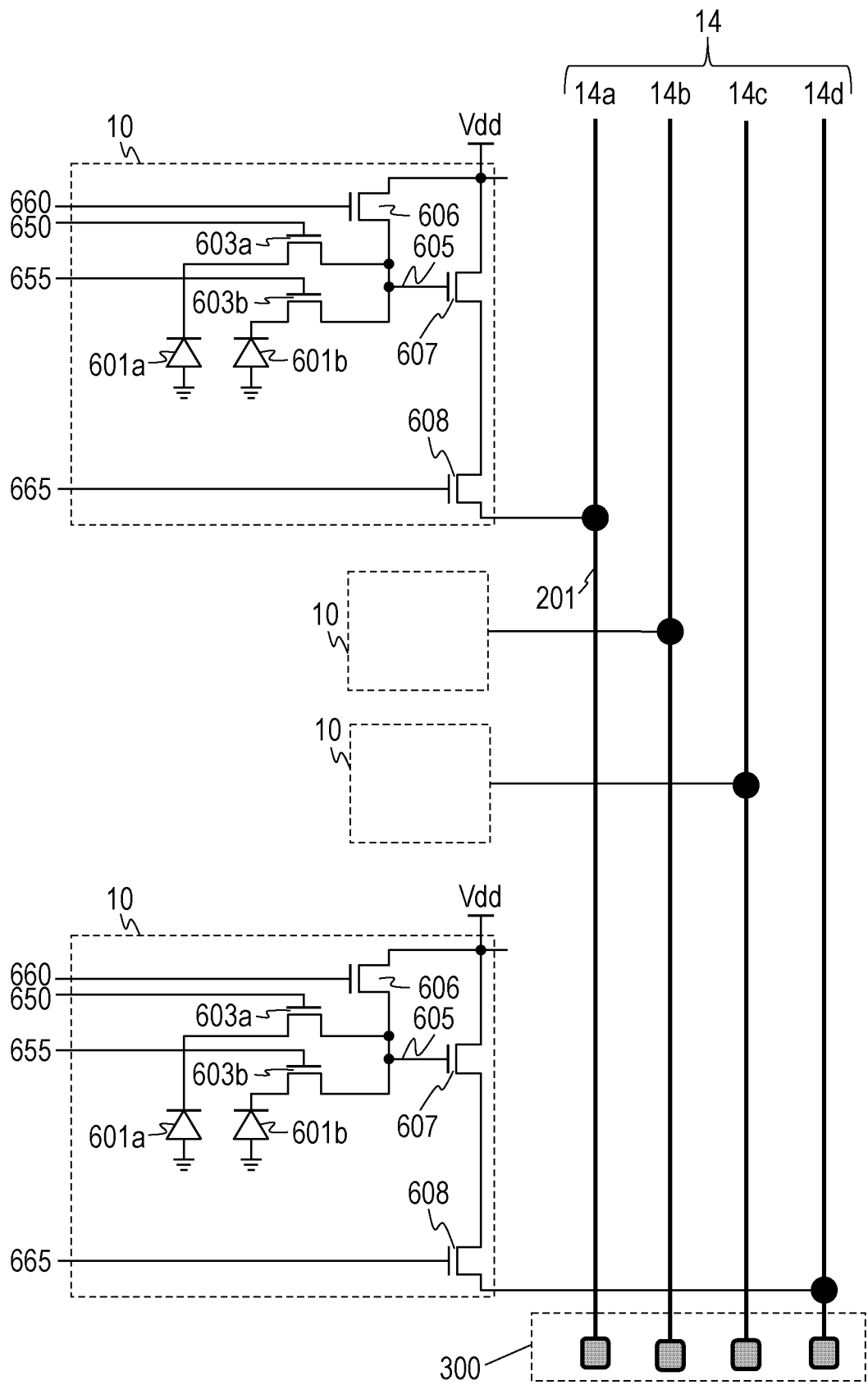
FIG. 8 is a schematic diagram illustrating a semiconductor apparatus.

FIG. 8 illustrates an example of equivalent circuits of the pixel circuits 10. Each of the pixel circuits 10 has photoelectric converting elements 601a, 601b that are photodiodes. The pixel circuit 10 has an amplification transistor 607 being the aforementioned amplifying element. One pixel circuit 10 corresponds to one amplifying element (amplification transistor 607). In a case where, like this embodiment, a plurality of photoelectric converting elements 601a and 601b share the amplification transistor 607, one pixel circuit 10 includes one amplification transistor 607 and a plurality of photoelectric converting elements 601a, 601b. The photoelectric conversion elements 601a and 601b receive light transmitted through one microlens, not illustrated, and a color filter. In other words, the light incident on the photoelectric conversion element 601a has a substantially equal wavelength to that of the light incident on the photoelectric conversion element 601b. The pixel PXC is an optical unit defined for a microlens, a color filter, and the photoelectric converting elements 601a, 601b. The photoelectric conversion element 601a is connected to an electric charge detection unit 605 through a transfer transistor 603a. The electric charge detection unit 605 has a floating diffusion structure. The transfer transistor 603a has a gate connected to a scanning circuit, not illustrated, through a control line 650. The photoelectric conversion element 601b is connected to the electric charge detection unit 605 through the transfer transistor 603b. The transfer transistor 603b has a gate connected to a scanning circuit, not illustrated, through a control line 655.

The electric charge detection unit 605 is connected to a reset transistor 606 and a gate of an amplification transistor 607. The reset transistor 606 and the amplification transistor 607 receive power supply voltage Vdd. The reset transistor 606 has a gate connected to a scanning circuit, not illustrated, through the control line 660.

The amplification transistor 607 is connected to a selection transistor 608. The selection transistor 608 has a gate connected to a vertical scanning circuit, not illustrated, through a control line 665. The selection transistor 608 is connected to any one signal line of the plurality of signal lines 14a to 14d. The semiconductor elements 100 (101 to 106) to be connected to the connecting unit 300 according to this embodiment is the selection transistor 608 or, if the selection transistor 608 is omitted, it is the amplification transistor 607.

Figure 9:
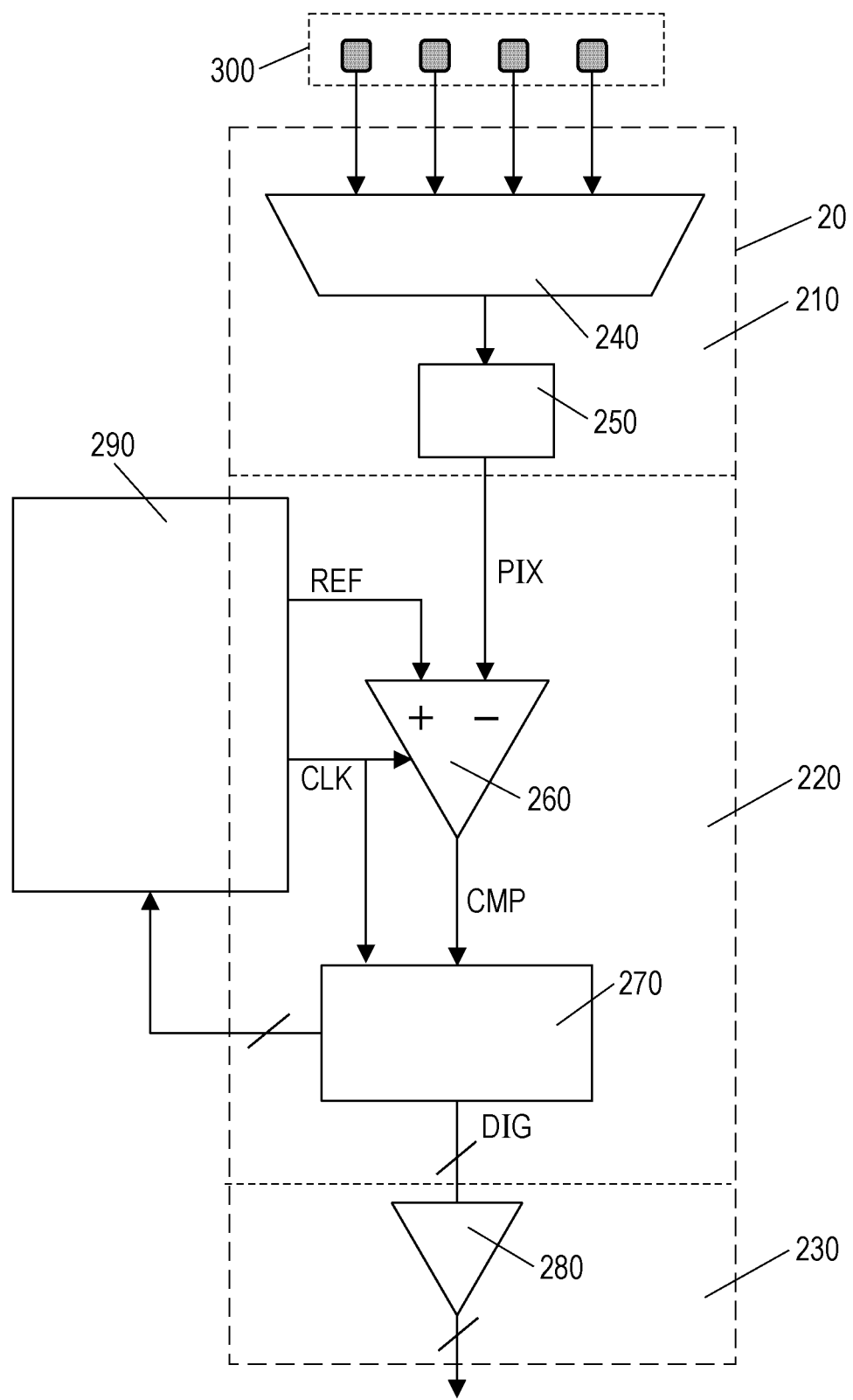
FIG. 9 is a schematic diagram illustrating a semiconductor apparatus.

FIG. 9 illustrates an example of an equivalent circuit of the electric circuit 20. A selection circuit 240 provided in the input unit 210 may be a multiplexer, for example. The semiconductor element 200 (201 to 206) connected to the connecting unit 300 can possibly be an input transistor of the multiplexer according to this embodiment. The electric circuit 20 in this example can include a successive approximation register (SAR) analog-digital converter as the main unit 220. A pixel signal PIX selected by the selection circuit 240 is input to an inverting input terminal (−) of a comparator circuit 260 in the main unit 220 through an auxiliary circuit 250 provided in the input unit 210. The auxiliary circuit 250 may be a sample/hold circuit and/or an amplifying circuit. A reference signal REF is input to a non-inverting input terminal (+) of the comparator circuit 260. The reference signal REF is supplied from a signal generating circuit 290. The signal generating circuit 290 can include a digital-analog converter (DAC). A part of the signal generating circuit 290 may be included in the electric circuits 20 arranged in a matrix form, and the remaining part may be arranged in a peripheral area PR (see FIGS. 1A and 1B). The comparator circuit 260 outputs a comparison signal CMP indicative of a comparison result being a magnitude relationship between the pixel signal PIX and the reference signal REF. The comparison signal CMP is stored by a storage circuit 270. The storage circuit 270 may be a digital memory. The comparator circuit 260 and the storage circuit 270 is synchronized with a synchronization signal CLK from the signal generating circuit 290. The signal generating circuit 290 can operate in accordance with the signal stored in the storage circuit 270. The storage circuit 270 holds a digital signal DIG. The output unit 230 includes a selection transistor to be selected by a scanning circuit (not illustrated), and when the selection transistor selected by the scanning circuit is turned on, data from a desired electric circuit 20 can be read out from a readout circuit (not illustrated). A digital signal (data) is output from an output circuit 280 provided in the output unit 230. The output circuit 280 may include a sensing amplifier, for example. The output circuit 280 can include a parallel-serial converter and an interface circuit configured to communicate Low Voltage Differential Signaling (LVDS).

A reference signal REF1 having a first signal level is input, and a first comparison signal CMP1 indicative of the comparison result is stored in memory as a higher order bit. Next, a reference signal REF2 having a second signal level different from the first signal level based on the first comparison signal CMP1 is input, and a second comparison signal CMP2 indicative of the comparison result is stored in memory as a middle order bit. Next, a reference signal REF 3 having a third signal level different from the second signal level based on the second comparison signal CMP2 is input, and a third comparison signal CMP 3 indicative of the comparison result is stored in memory as a lower order bit. In this manner, a plurality of comparisons are repeated so that digital signals DIG having a plurality of bits can be acquired.

It should be noted that the electric circuit 20 can perform inclination analog-digital conversion. In this case, the signal generating circuit 290 generates a ramp signal as a reference signal REF and a count signal (not illustrated). The comparator circuit 260 is configured to inversion an output of a comparison signal CMP when the comparison result between the reference signal REF and the pixel signal PIX changes. When the comparison signal CMP is inverted, the storage circuit 270 obtains a count signal so that a digital signal DIG corresponding to the count value of the count signal can be obtained.

Equipment Including Semiconductor Apparatus

In this embodiment, an equipment EQP illustrated in FIG. 1A will be described in detail. The semiconductor apparatus APR can include a package PKG configured to accommodate a semiconductor apparatus IC as well as a semiconductor apparatus IC that is a laminated member of the chips 1 and 2. The package PKG can include a base member having a semiconductor apparatus IC fixed thereon, lid body of glass facing the a semiconductor apparatus IC, and a connection member such as a bonding wire or a bump configured to connect a terminal provided on the base member and a terminal provided in the semiconductor apparatus IC.

The equipment EQP can further include at least one of an optical system OPT, a control apparatus CTRL, a processing apparatus PRCS, display apparatus DSPL, and memory apparatus MMRY. The optical system OPT is configured to be focused on the semiconductor apparatus APR as a photoelectric conversion apparatus, such as a lens, a shutter, and a mirror. The control apparatus CTRL is configured to control the semiconductor apparatus APR, such as a semiconductor apparatus such as ASIC. The processing apparatus PRCS is configured to process a signal output from the semiconductor apparatus APR and may be a semiconductor apparatus such as a CPU (central processing unit) or an ASIC (application-specific integrated circuit) for configuring an AFE (analog front end) or DFE (digital front end). The display apparatus DSPL is configured to display information (image) acquired by the semiconductor apparatus APR and is an EL display apparatus or a liquid crystal display apparatus. The memory apparatus MMRY is a magnetic apparatus or a semiconductor apparatus configured to store information (image) acquired by the semiconductor apparatus APR. The memory apparatus MMRY may be a volatile memory such as an SRAM or a DRAM or a nonvolatile memory such as a flash memory or a hard disk drive. A machine apparatus MCHN has a movable part or driving part such as a motor or an engine. In the equipment EQP, a signal output from the semiconductor apparatus APR may be displayed on the display apparatus DSPL or may be transmitted externally through a communication apparatus (not illustrated) included in the equipment EQP. Accordingly, the equipment EQP may further include a memory apparatus MMRY and a processing apparatus PRCS in addition to a storage control unit and an arithmetic operation control unit included in the semiconductor apparatus APR.

The equipment EQP illustrated in FIG. 1A can be an electronic equipment such as an information terminal (such as a smart phone and a wearable terminal) having an imaging function, a camera (such as a lens replacement camera, a compact camera, a video camera, and a monitor camera). The machine apparatus MCHN with a camera can drive an optical system OPT parts for zooming, focusing, and shutter operations. The equipment EQP can be a transport apparatus (moving body) such as a vehicle, a ship, or an airplane. The machine apparatus MCHN in a transport apparatus can be used as a movement apparatus. The equipment EQP being a transport apparatus may be configured to transport a semiconductor apparatus APR aid and/or automate driving (steering) by an imaging function. The processing apparatus PRCS configured to aid and/or automate driving (steering) can perform processing for operating the machine apparatus MCHN being a moving apparatus based on information acquired by the semiconductor apparatus APR.

A semiconductor apparatus APR according to the this embodiment can provide high value to designers, manufactures, sellers, purchasers and/or users. Installing a semiconductor apparatus APR in the equipment EQP can improve the value of the equipment EQP. Therefore, determination of installation of a semiconductor apparatus APR in the equipment EQP according to this embodiment in manufacturing or selling the equipment EQP can advantageously increase the value of the equipment EQP.

The aforementioned embodiments can be changed, altered or modified as required without departing from the spirit and scope of the present disclosure. The disclosure of the embodiments can include not only details specified herein but also all matters grasped from the Description and the appended drawings. Components with the same names but with different references can be distinguished as a first component, a second component, a third component and so on.

Embodiments of the present disclosure can provide an advantageous technology for enhanced value of a semiconductor apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-192048 filed Sep. 29, 2017, which is hereby incorporated by reference herein in its entirety.

What is claimed is:

1. A semiconductor apparatus comprising a stack of a first chip and a second chip, wherein the first chip has a plurality of pixel circuits arranged in a matrix form of J rows and K columns, and the second chip has a plurality of electric circuit arranged in a matrix form of T rows and U columns,
wherein the first chip includes a first semiconductor layer having a plurality of semiconductor elements configuring the plurality of pixel circuits and a first wiring structure including M wiring layers configuring the plurality of pixel circuits;
wherein the second chip includes a second semiconductor layer having a plurality of semiconductor elements configuring the plurality of electric circuits and a second wiring structure including N wiring layers configuring the plurality of electric circuits,
wherein the first wiring structure is placed between the first semiconductor layer and the second semiconductor layer,
wherein the second wiring structure is placed between the first wiring structure and the second semiconductor layer,
wherein a first conductive portion included in an M-th wiring layer of the first wiring structure from the first semiconductor layer and connected to a circuit of the plurality of pixel circuits and a second conductive portion included in an N-th wiring layer of the second wiring structure from the second semiconductor layer and connected to a circuit of the plurality of electric circuit are electrically connected,
wherein a third conductive portion included in the M-th wiring layer and connected to a circuit of the plurality of pixel circuits and a fourth conductive portion included in the N-th wiring layer and connected to a circuit of the plurality of electric circuit are electrically connected,
wherein a shortest wiring path from the second conductive portion to the plurality of semiconductor elements configuring the plurality of pixel circuits is a first length, and a shortest wiring path from the first conductive portion to the plurality of semiconductor elements configuring the plurality of electric circuits is a second length,
wherein a shortest wiring path from the fourth conductive portion to the plurality of semiconductor elements configuring the plurality of pixel circuits is a third length, and a shortest wiring path from the third conductive portion to the plurality of semiconductor elements configuring the plurality of electric circuit is a fourth length,
wherein a sum of the third length and the fourth length is longer than a sum of the first length and the second length.

2. The semiconductor apparatus according to claim 1, wherein the third length is longer than the first length.

3. The semiconductor apparatus according to claim 1, wherein the fourth length is longer than the third length.

4. The semiconductor apparatus according to claim 1, wherein the fourth length is longer than the second length.

5. The semiconductor apparatus according to claim 4, wherein M≤N.

6. The semiconductor apparatus according to claim 4, wherein two or more pixel circuits of the plurality of pixel circuits are connected in common to a common line.

7. The semiconductor apparatus according to claim 6, wherein the common line is included in a range from the first semiconductor layer to an m-th (m<M) wiring layer of the first wiring structure.

8. The semiconductor apparatus according to claim 6, wherein a wire connecting the common line and the first conductive portion is included in a range from the first semiconductor layer to (m+µ)-th (m+µ>m) wiring layer of the first wiring structure.

9. The semiconductor apparatus according to claim 6, wherein a wire receiving a fixed potential is placed between a wire connecting the common line and the first conductive portion and the common line.

10. The semiconductor apparatus according to claim 1, wherein the first conductive portion and the second conductive portion are positioned between the first semiconductor layer and the circuit of the plurality of electric circuits to which the second conductive portion is connected.

11. The semiconductor apparatus according to claim 1,
wherein a shortest distance from the third conductive portion to the plurality of semiconductor elements configuring the plurality of electric circuit is longer than a shortest distance from the first conductive portion to the plurality of semiconductor elements configuring the plurality of electric circuits.

12. The semiconductor apparatus according to claim 11,
wherein the first wiring structure includes a plurality of signal lines to which at least two of the plurality of pixel circuits are respectively connected, the plurality of signal lines are arranged in a direction where the K columns are arranged,
wherein an e1-th signal line of the plurality of signal lines is connected to an electric circuit of the p-th row and the v-th column of the plurality of electric circuits, and wherein an f1-th signal line of the plurality of signal lines is connected to an electric circuit of the q-th row and the v-th column of the plurality of electric circuit.

13. The semiconductor apparatus according to claim 12, wherein an e2-th signal line of the plurality of signal lines is connected to an electric circuit of the p-th row and the w-th column of the plurality of electric circuit, and
an f2-th signal line of the plurality of signal lines is connected to an electric circuit of the q-th row and the w-th column of the plurality of electric circuits.

14. The semiconductor apparatus according to claim 13, wherein e1<f1<e2<f2.

15. The semiconductor apparatus according to claim 12, wherein a g2-th signal line of the plurality of signal lines is connected to an electric circuit of an r-th row and the w-th column of the plurality of electric circuit, and
an h2-th signal line of the plurality of signal lines is connected to an electric circuit of an s-th row and the w-th column of the plurality of electric circuit.

16. The semiconductor apparatus according to claim 11, wherein J≤T×U<J×K/2, 4≤T, 5≤U.

17. The semiconductor apparatus according to claim 11, wherein each of the plurality of electric circuit includes a selection circuit connecting to two or more pixel circuits of the plurality of pixel circuits.

18. The semiconductor apparatus according to claim 11, wherein each of the plurality of electric circuits includes at least a part of an analog-digital converter.

19. The semiconductor apparatus according to claim 18, wherein each of the plurality of electric circuits includes a comparator circuit.

20. An equipment comprising the semiconductor apparatus according to claim 1,
and further comprising at least some of: an optical system configured to be focused on the semiconductor apparatus, a control apparatus configured to control the semiconductor apparatus, a processing apparatus configured to process a signal output from the semiconductor apparatus, a machine apparatus configured to ne controlled based on information obtained by the semiconductor apparatus, a display apparatus configured to display the information obtained by the semiconductor apparatus, and a memory apparatus configured to store the information obtained by the semiconductor apparatus.

* * * * *